(12) United States Patent
Park et al.

(10) Patent No.: US 11,387,294 B2
(45) Date of Patent: Jul. 12, 2022

(54) DISPLAY DEVICE

(71) Applicant: Samsung Display Co., Ltd., Yongin-si (KR)

(72) Inventors: Young Woo Park, Yongin-si (KR); Mi Young Kim, Hwaseong-si (KR); Sang Hyun Jun, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/001,033

(22) Filed: Aug. 24, 2020

(65) Prior Publication Data

US 2021/0143225 A1    May 13, 2021

(30) Foreign Application Priority Data

Nov. 12, 2019    (KR) .................. 10-2019-0144085

(51) Int. Cl.
| | |
|---|---|
| *G06F 3/041* | (2006.01) |
| *H01L 27/32* | (2006.01) |
| *G06F 3/044* | (2006.01) |
| *H01L 51/52* | (2006.01) |

(52) U.S. Cl.
CPC .......... *H01L 27/323* (2013.01); *G06F 3/0443* (2019.05); *H01L 51/5237* (2013.01)

(58) Field of Classification Search
CPC .... G06F 3/0412; G06F 3/0443; G06F 3/0446; H01L 27/323; H01L 51/5237
See application file for complete search history.

(56) References Cited

U.S. PATENT DOCUMENTS

| | | | | |
|---|---|---|---|---|
| 2014/0042406 | A1* | 2/2014 | Degner | .................. H05K 1/028 257/40 |
| 2017/0062537 | A1* | 3/2017 | Kim | ..................... H01L 27/3248 |

FOREIGN PATENT DOCUMENTS

| | | |
|---|---|---|
| KR | 10-2016-0119934 A | 10/2016 |
| KR | 10-1663763 B1 | 10/2016 |
| KR | 10-2017-0106621 A | 9/2017 |
| KR | 10-2017-0140131 A | 12/2017 |

* cited by examiner

*Primary Examiner* — Insa Sadio
(74) *Attorney, Agent, or Firm* — Lewis Roca Rothgerber Christie LLP

(57) ABSTRACT

A display device includes: a display unit including a flat part and a curved part which is formed to be bent from sides of the flat part; a sensing unit on the display unit to overlap with the flat part and the curved part; and a passivation layer on the sensing unit, wherein the passivation layer overlaps with the flat part and the passivation layer does not overlap the curved part.

21 Claims, 18 Drawing Sheets

DISPLAY DEVICE

CROSS-REFERENCE TO RELAYED APPLICATION

This application claims priority to and the benefit of Korean Patent Application No. 10-2019-0144085, filed on Nov. 12, 2019, the disclosure of which is incorporated herein by reference in its entirety.

BACKGROUND

1. Field

Aspects of some example embodiments of the present disclosure relate to a display device.

2. Description of the Related Art

Display devices have become increasingly important with the development of multimedia, and various types of display devices, such as liquid crystal display (LCD) devices, organic light-emitting diode (OLED) display devices, or the like, have been used. For example, OLED display devices, which are a type of self-emitting display device, have been identified as a next-generation display device because of relatively improved viewing angles.

However, because light-emitting elements of OLED display devices tend to deteriorate upon exposure to external moisture or oxygen, the light-emitting elements may be encapsulated to be protected from external moisture, oxygen, or other contaminants. Recently, a multilayer thin-film encapsulation (TFE) including a plurality of inorganic films, or both organic films and inorganic films, have been used to seal the light-emitting elements to provide a thin and/or flexible OLED display device.

The above information disclosed in this Background section is only for enhancement of understanding of the background and therefore the information discussed in this Background section does not necessarily constitute prior art.

SUMMARY

Aspects of some example embodiments of the present disclosure include a display device capable of preventing or reducing instances of cracks being generated in the process of forming curved parts that are bent to have curvature.

However, embodiments according to the present disclosure are not restricted to those set forth herein. The above and other embodiments of the present disclosure will become more apparent to one of ordinary skill in the art to which the present disclosure pertains by referencing the detailed description of the present disclosure given below.

According to some example embodiments of the present disclosure, a display device includes a display unit including a flat part and a curved part which is formed to be bent from sides of the flat part, a sensing unit on the display unit and overlapping with the flat part and the curved part; and a passivation layer on the sensing unit, wherein the passivation layer overlaps with the flat part, but does not overlap the curved part in a plan view (e.g., when viewed from a direction perpendicular to a primary plane of the display surface).

According to some example embodiments, the display device includes a cover window on the passivation layer and overlapping the flat part and the curved part.

According to some example embodiments, the curved part includes a first curved part, which is bent at a first curvature along a first bending line that is a first side of the flat part.

According to some example embodiments, the first curvature is a varying curvature.

According to some example embodiments, the first curvature becomes smaller in an outward direction away from the flat part.

According to some example embodiments, a first side of the passivation layer is on the inside of the first bending line.

According to some example embodiments, the curved part further includes a second curved part, which is bent at a second curvature along a second bending line that is a second side of the flat part.

According to some example embodiments, first and second sides of the passivation layer are on the inside of the first and second bending lines, respectively.

According to some example embodiments of the present disclosure, a display device includes a display unit including a flat part and a curved part which is formed to be bent at a first curvature from sides of the flat part; a sensing unit on the display unit to overlap with the flat part and the curved part; and a passivation layer on the sensing unit to overlap with the flat part and the curved part, wherein the first curvature is a varying curvature, the curved part includes a minimum curved part having a first minimum curvature, and the passivation layer is not on the minimum curved part.

According to some example embodiments, the passivation layer is at regions other than on the minimum curved part.

According to some example embodiments, the first curvature becomes smaller in an outward direction away from the flat part.

According to some example embodiments, the sensing unit includes a sensing area and a sensing peripheral area, which is on the periphery of the sensing area, and includes a sensing conductive layer on the display unit, and a sensing insulating layer on the sensing conductive layer, and the sensing conductive layer includes a sensing electrode in the sensing area, and a sensing line connected to the sensing electrode and in the sensing peripheral area.

According to some example embodiments, the flat part overlaps with the sensing area, and the curved part overlaps with part of the sensing area and with the sensing peripheral area.

According to some example embodiments, the passivation layer includes a first passivation layer on the sensing electrode in the sensing area, and a second passivation layer on the sensing line in the sensing peripheral area.

According to some example embodiments, the first passivation layer and the second passivation layers are spaced apart from each other.

According to some example embodiments, a cover window is on the passivation layer and overlaps with the flat part and the curved part.

According to some example embodiments of the present disclosure, a display device includes a display unit including a first region, which includes a flat part and a curved part extending from the flat part to have a first curvature, a second region, which is spaced apart from the curved part of the first region and has a second curvature, and third region, which is between the curved part of the first region and the second region and has a third curvature; a sensing unit overlapping with the first region, the second region, and the third region of the display unit; and a passivation layer overlapping with the first region, the second regions, and the third regions of the display unit, the passivation layer includes a first section, which overlaps with the first region, second section, which overlaps with the second region, and third section, which overlaps with the third region and has a smaller height than the first section and the second sections.

According to some example embodiments, the third curvature is smaller than the first and second curvatures.

According to some example embodiments, a cover window is on the passivation layer.

According to some example embodiments, the sensing unit includes a sensing conductive layer on the display unit, and a sensing insulating layer on the sensing conductive layer, and the sensing conductive layer includes a sensing electrode overlapping the first region, and a sensing line connected to the sensing electrode and are in the second region.

According to the aforementioned and other example embodiments of the present disclosure, a display device including a flat part and curved parts is provided, and a passivation layer is not provided in at least some of the curved parts that are bent to have curvature. Accordingly, a display device according to some example embodiments may be capable of preventing or reducing instances of cracks being generated in the process of forming the curved parts.

In addition, the thickness of a passivation layer may be reduced in regions where curved parts with varying curvature have a minimum curvature. Accordingly, a display device according to some example embodiments may be capable of preventing or reducing instances of cracks being generated in the process of forming the curved parts.

Other features and embodiments may be more apparent from the following detailed description, the drawings, and the claims.

BRIEF DESCRIPTION OF THE DRAWINGS

The above and other embodiments and characteristics of the present disclosure will become more apparent by describing in more detail aspects of example embodiments thereof with reference to the attached drawings, in which.

DETAILED DESCRIPTION

Figure 1:
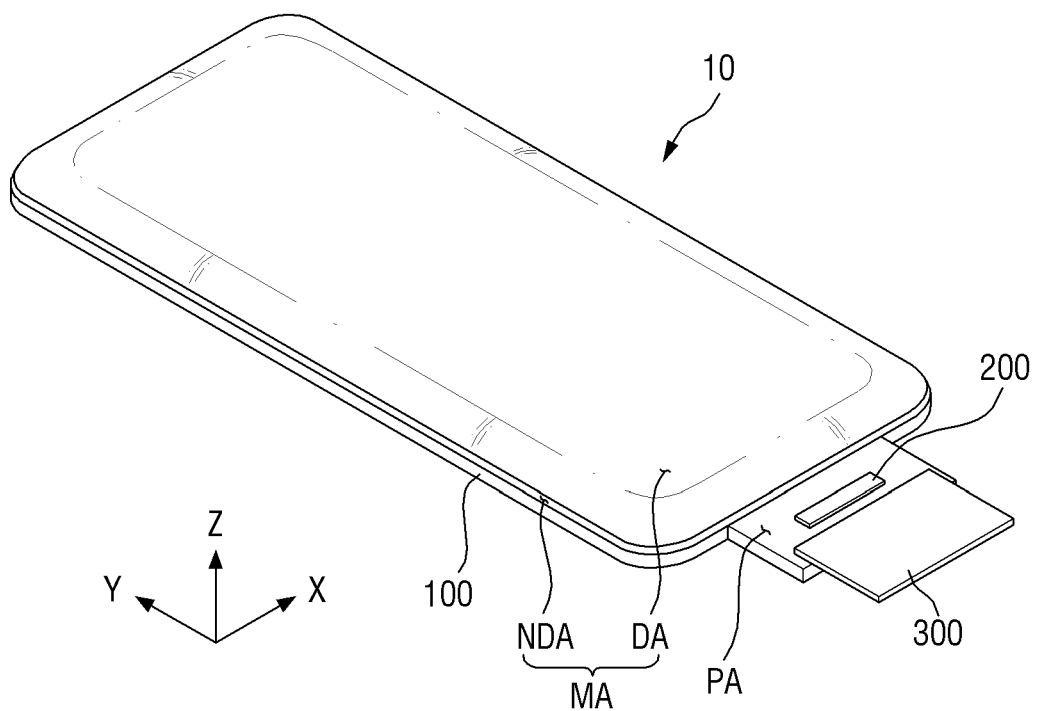
FIG. 1 is a perspective view of a display device according to some example embodiments of the present disclosure.

Further details of some example embodiments of the present invention will now be described more fully hereinafter with reference to the accompanying drawings, in which aspects of some example embodiments of the invention are shown. This invention may, however, be embodied in different forms and should not be construed as being limited to the example embodiments set forth herein. Rather, these example embodiments are provided so that this disclosure will be more thorough and more complete, and will more fully convey the scope of embodiments according to the invention to those skilled in the art.

It will also be understood that when a layer is referred to as being "on" another layer or substrate, it can be directly on the other layer or substrate, or intervening layers may also be present. In contrast, when an element is referred to as being "directly on" another element, there are no intervening elements present.

The same reference numbers indicate the same components throughout the specification. In the attached figures, the thickness of layers and regions is exaggerated for clarity.

Like reference numerals indicate like elements throughout the specification.

Embodiments of the present disclosure will hereinafter be described with reference to the accompanying drawings.

In the accompanying drawings, first, second, and third directions X, Y, and Z are defined. The first and second directions X and Y may be directions that are perpendicular to each other on a single plane. The third direction Z may be a direction that is perpendicular to the plane including the first and second directions X and Y. The third direction Z may be perpendicular to both the first and second directions X and Y. The third direction Z refers to the thickness direction of a display device 10.

Unless specified otherwise, the terms "above" or "top", as used herein, refer to an upward direction from a display panel 100, i.e., the third direction Z, and the term "top surface", as used herein, refers to a surface that faces the third direction Z. Also, unless specified otherwise, the terms "below" or "bottom", as used herein, refer to a downward direction from the display panel 100, i.e., the opposite direction of the third direction Z, and the term "bottom surface", as used herein, refers to a surface that faces the opposite direction of the third direction Z. Also, unless specified otherwise, the terms "left", "right", "upper", and "lower", as used herein, refer to their respective directions as viewed from above the display panel 100. For example, the terms "left", "right", "upper", and "lower" refer to the opposite direction of the first direction X, the first direction X, the second direction Y, and the opposite direction of the second direction Y, respectively.

Figure 2:
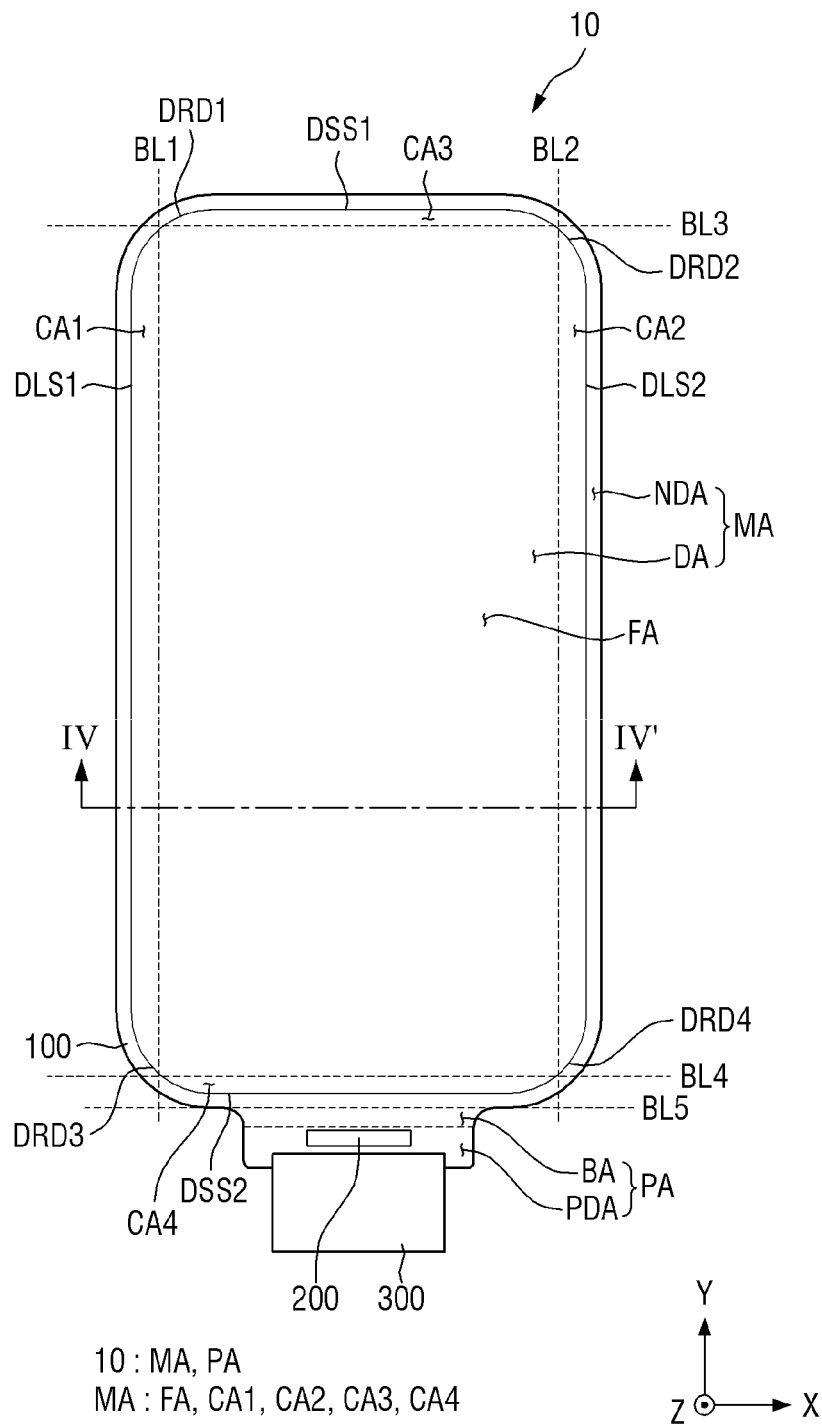
FIG. 2 is a plan view of the display device of FIG. 1.
Figure 3:
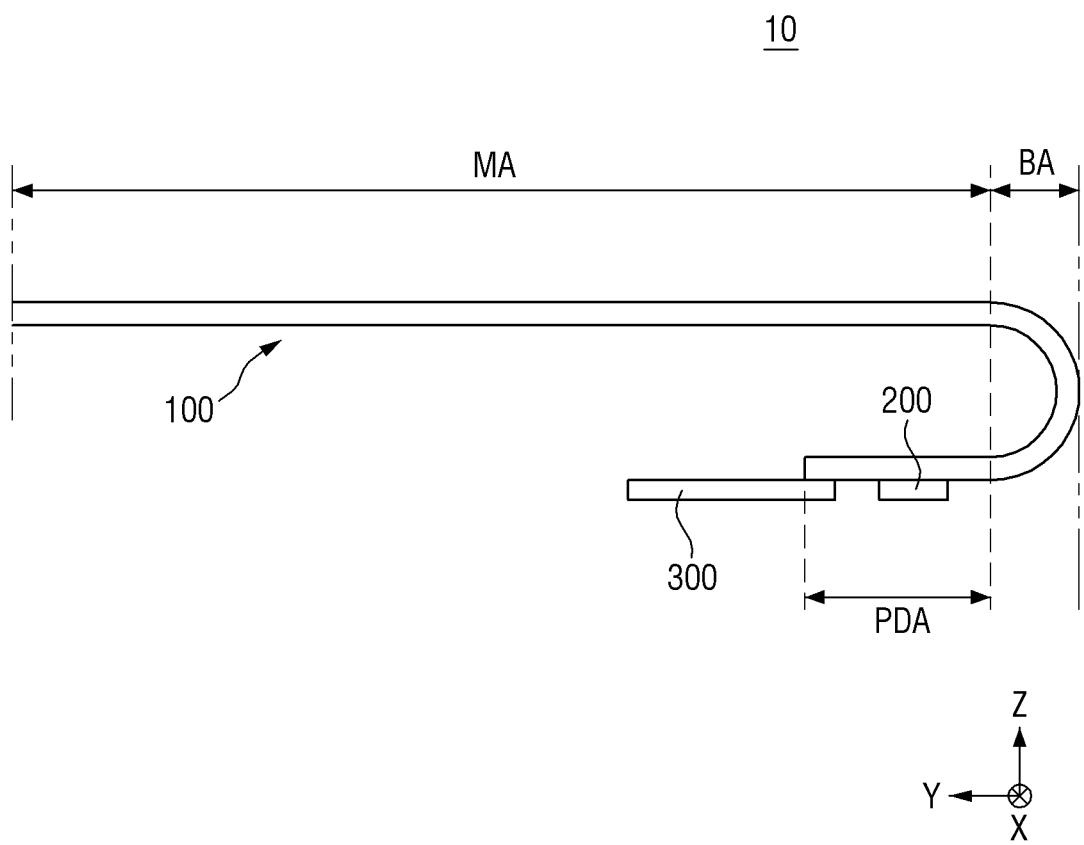
FIG. 3 is a side view of the display device of FIG. 1.

FIG. 1 is a perspective view of a display device according to some example embodiments of the present disclosure. FIG. 2 is a plan view of the display device of FIG. 1. FIG. 3 is a side view of the display device of FIG. 1.

Referring to FIGS. 1 through 3, a display device 10, which is a device for displaying a moving or still image, may be used not only as the display screen of a portable electronic device such as a mobile phone, a smartphone, a tablet personal computer (PC), a smartwatch, a watchphone, a mobile communication terminal, an electronic notepad, an electronic book (e-book), a portable multimedia player (PMP), a navigation device, or a ultra-mobile PC (UMPC), but also as the display screen of various other products or electronic devices such as televisions (TVs), laptop computers, monitors, billboards, or internet-of-tings (IoT) devices.

The display device 10 may include a display panel 100, a display driving circuit 200, and a circuit board 300.

The display panel 100 may include a flexible substrate that is bendable, foldable, or rollable. For example, the flexible substrate may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof.

The display panel 100 may include a main area MA and a protruding area PA, which protrudes from one side of the main area MA.

The main area MA may have a similar shape to the exterior shape of the display device 10. The main area MA may be formed to have a rectangular shape, in a plan view, having short sides in the first direction (or an X-axis direction) and long sides in the second direction Y (or a Y-axis direction). The corners where the short sides in the first direction X and the long sides in the second direction Y meet may be rounded to have a curvature (e.g., a set or predetermined curvature). FIGS. 1 and 2 illustrate that the display device 10 has a rectangular shape with rounded corners in a plan view, but embodiments according to the present disclosure are not limited thereto. For example, according to some example embodiments, the display device 10 may be formed into various other shapes such as a polygonal shape other than a rectangular shape, a circular shapes, or an elliptical shape.

The main area MA may include a display area DA, in which a plurality of pixels are formed or arranged to display images (e.g., static or video images), and a non-display area NDA, which is a region on the periphery of the display area DA.

As illustrated in FIG. 2, the display area DA may include first, second, third, and fourth display round parts DRD1, DRD2, DRD3, and DRD4. The first display round part DRD1 may correspond to the corner between a first display short side DSS1 and a first display long side DLS1. The second display round part DRD2 may correspond to the corner between a second display short side DSS2 and a second display long side DLS2. The third display round part DRD3 may correspond to the corner between a third display short side DSS3 and a third display long side DLS3. The fourth display round part DRD4 may correspond to the corner between a fourth display short side DSS4 and a fourth display long side DLS4. The first, second, third, and fourth display round parts DRD1, DRD2, DRD3, and DRD4 may have substantially the same curvature or different curvatures. Alternatively, at least two of the first, second, third, and fourth display round parts DRD1, DRD2, DRD3, and DRD4 may have the same curvature. Each of the first, second, third, and fourth display round parts DRD1, DRD2, DRD3, and DRD4 may have substantially uniform curvature or varying curvature.

The non-display area NDA may be defined as an area ranging from the outer boundaries of the display area DA to the edges of the display panel 100. In addition to the pixels, scan lines, data lines, and power supply lines, which are connected to the pixels, may be located in the display area DA. A scan driver (SD of FIG. 6), which applies scan signals to the scan lines in the display area DA, and link lines, which connect the data lines and the display driving circuit 200, may be located in the non-display area NDA. Also, an outermost black matrix may be located in the non-display area NDA, but embodiments according to the present disclosure are not limited thereto.

The main area MA may further include a flat part FA, which is formed to be flat, and curved parts (CA1, CA2, CA3, and CA4), which extend from the edges of the flat part FA and are formed to be curved. The flat part FA of the main area MA may be located in the display area DA. The curved parts (CA1, CA2, CA3, and CA4) of the main area MA may include a first curved part CA, which extends from the left side of the flat part FA, a second curved part CA2, which extends from the right side of the flat part FA, a third curved part CA3, which extends from the upper side of the flat part FA, and a fourth curved part CA4, which extends from the lower side of the flat part FA.

The first curved part CA1 refers to an area that is curved at first curvature along a first bending line BL1. The second curved part CA2 refers to an area that is curved at second curvature along a second bending line BL2. The third curved part CA3 refers to an area that is curved at third curvature along a third bending line BL3. The fourth curved part CA4 refers to an area that is curved at fourth curvature along a fourth bending line BL4. The first, second, third, and fourth curvatures may be substantially the same or may differ from one another. Also, the first, second, third, and fourth curvatures may be uniform or may vary.

At least one of the first, second, third, or fourth curved parts CA1, CA2, CA3, and CA4 may be located in the display area DA. The first, second, third, and fourth curved parts CA1, CA2, CA3, and CA4 are illustrated as all being located in the display area DA, in which case, an image from the display panel 100 can be seen even on the first, second, third, and fourth curved parts CA1, CA2, CA3, and CA4. However, the present disclosure is not limited to this. Alternatively, some of the first, second, third, and fourth curved parts CA1, CA2, CA3, and CA4 may not be located in the display area DA. The first, second, third, and fourth curved parts CA1, CA2, CA3, and CA4 may be located in the display area DA and may extend outwardly from the edges of the display area DA to be also located in or overlapping with the non-display area NDA.

The protruding area PA may be formed to protrude from one side of the main area MA. For example, the protruding area PA may be formed to protrude from the lower side of the main area MA. The length, in the first direction X, of the protruding area PA may be smaller than the length, in the first direction X, of the main area MA.

The protruding area PA may include a bending area BA and a pad area PDA. The pad area PDA may be located on one side of the bending area BA, and the main area MA may be located on the other side of the bending area BA. For example, the pad area PDA may be located on the lower side of the bending area BA, and the main area MA may be located on the upper side of the bending area BA.

The bending area BA may be bent at fifth curvature along a fifth bending line BL5. The bending area BA may be bent at the fifth curvature in the opposite direction of the third direction Z, i.e., in a direction opposite to the display surface of the display panel 100. As the display panel 100 is bent in the bending area BA, the surface of the display panel 100 may be reversed. That is, the surface of the display panel 100 that faces upward may be reversed to face outward through the bending area BA and then downward.

The pad area PDA extends from the lower side of the bending area BA. When the display panel 100 is yet to be bent, the surface of the pad area PDA of the display panel 100 faces upward. Once the display panel 100 is bent, the surface of the pad area PDA of the display panel 100 faces downward. As a result, the pad area PDA may be placed below the main area MA and may overlap with the main area MA in the third direction Z.

A plurality of pads, which are electrically connected to the display driving circuit 200 and the circuit board 300, may be located in the pad area PDA of the display panel 100.

The display driving circuit 200 outputs signals and voltages for driving the display panel 100. For example, the display driving circuit 200 may provide data voltages to the data lines. Also, for example, the display driving circuit 200 may provide a power supply voltage to the power supply lines and may provide scan control signals to the scan driver SD. The display driving circuit 200 may be formed as an integrated circuit (IC) and may be mounted on the display panel 100 in the pad area PDA in a chip-on-glass (COG) or chip-on-plastic (COP) manner or through ultrasonic bonding, but the present disclosure is not limited thereto. For example, the display driving circuit 200 may be mounted on the circuit board 300.

The pads may include display pads, which are electrically connected to the display driving circuit 200, and touch pads, which are electrically connected to touch lines.

The circuit board 300 may be attached on the pads via an anisotropic conductive film. As a result, lead lines of the circuit board 300 may be electrically connected to the pads. The circuit board 300 may be a flexible printed circuit board, a printed circuit board, or a flexible film such as a chip-on-film.

Figure 4:
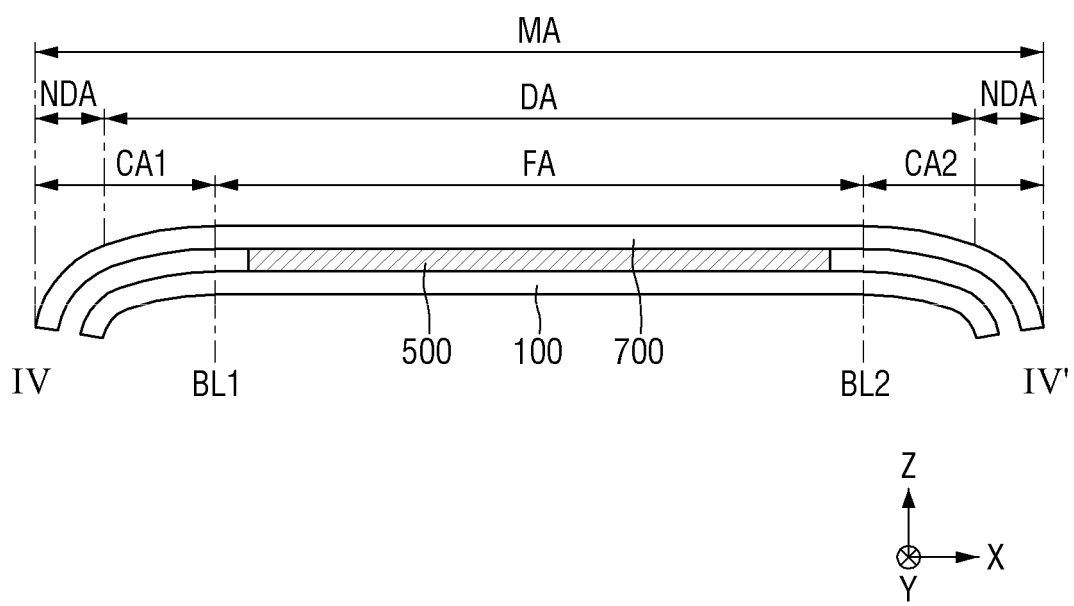
FIG. 4 is a cross-sectional view taken along the line I-I' of FIG. 1.
Figure 5:
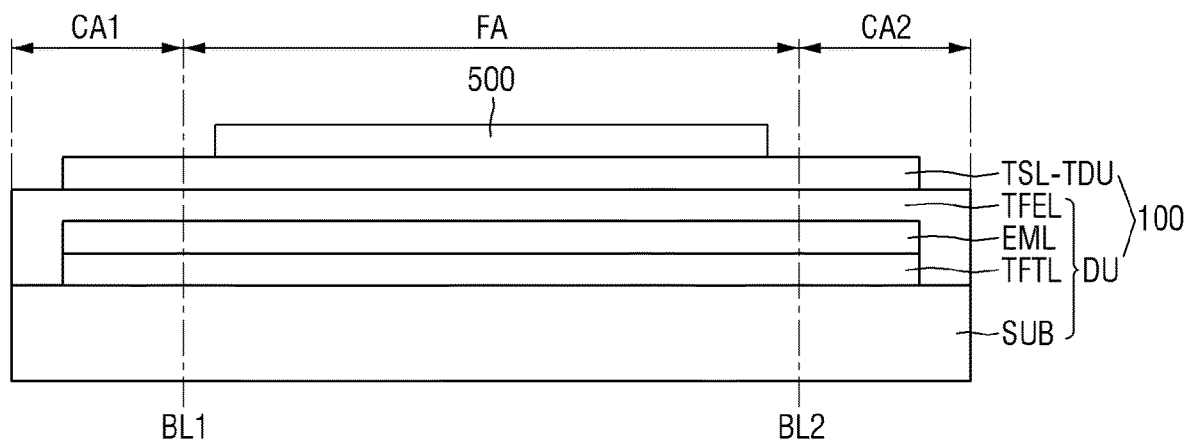
FIG. 5 is a cross-sectional view illustrating how a display panel and a passivation layer of FIG. 4 are stacked.
Figure 5:
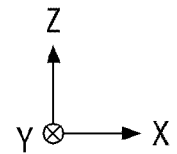

FIG. 4 is a cross-sectional view taken along the line I-I' of FIG. 1. FIG. 5 is a cross-sectional view illustrating the display panel of FIG. 4 and a passivation layer formed or arranged thereon.

Referring to FIGS. 4 and 5, the display device 10 may include the display panel 100, a passivation layer 500, which is formed or arranged on the display panel 100, and a cover window 700, which is formed or arranged on the passivation layer 500. The curved parts (CA1, CA2, CA3, and CA4) of the display panel 100 will hereinafter be described, taking the first and second curved parts CA1 and CA2, but obviously, the following description of the first and second curved parts CA1 and CA2 is also applicable to the third and fourth curved parts CA3 and CA4.

As already mentioned above, the display panel 100 may include the flat part FA and curved parts (CA1 and CA2), which extend from the flat part FA and are bent to have curvature. The curved parts (CA1 and CA2) may include the first curved part CA1, which extends from a first side (e.g., the left side) of the flat part FA along the first bending line BL1, and the second curved part CA2, which extends from a second side (e.g., the right side) of the flat part FA, opposite to the first side of the flat part FA, along the second bending line BL2.

The first and second curved parts CA1 and CA2 may have the first and second curvatures, respectively. The first and second curvatures may be varying curvatures, but the present disclosure is not limited thereto. Alternatively, the first and second curvatures may be uniform curvatures. The first and second curvatures will hereinafter be described as being varying curvatures. The first and second curvatures may become smaller in an outward direction away from the flat part FA. Because the curved parts (CA1 and CA2) of the display panel 100 are formed to have a smaller curvature in the outward direction away from the flat part FA, the planar size of the non-display area NDA of the display device 10 can be reduced.

The flat part FA may be arranged to overlap with the display area DA. The first curved part CA1, which extends outwardly from the flat part FA along the first bending line BL1, and the second curved part CA2, which extends outwardly from the flat part FA along the second bending line BL2, may be arranged to overlap with part of the display area DA and the non-display area NDA. Thus, an image may be displayed not only in the display area DA, but also in parts of the first and second curved parts CA1 and CA2 that overlap with the display area DA.

The display panel 100 may include a display unit (or display or display panel) DU, which includes a substrate SUB, a thin-film transistor (TFT) layer TFTL located on the substrate SUB, a light-emitting element layer EML, and a thin-film encapsulation (TFE) layer TFEL, and a sensing unit (or sensor) TDU, which includes a sensing layer TSL.

The substrate SUB may include an insulating material such as glass, quartz, or a polymer resin. The polymer material is PES, PA, PAR, PEI, PEN, PET, PPS, polyallylate, PI, PC, CAT, CAP, or a combination thereof. Alternatively, the substrate SUB may include a metallic material.

The substrate SUB may be a rigid substrate or a flexible substrate that is bendable, foldable, or rollable. In a case where the substrate SUB is a flexible substrate, the substrate SUB may be formed of PI, but the present disclosure is not limited thereto.

Figure 6:
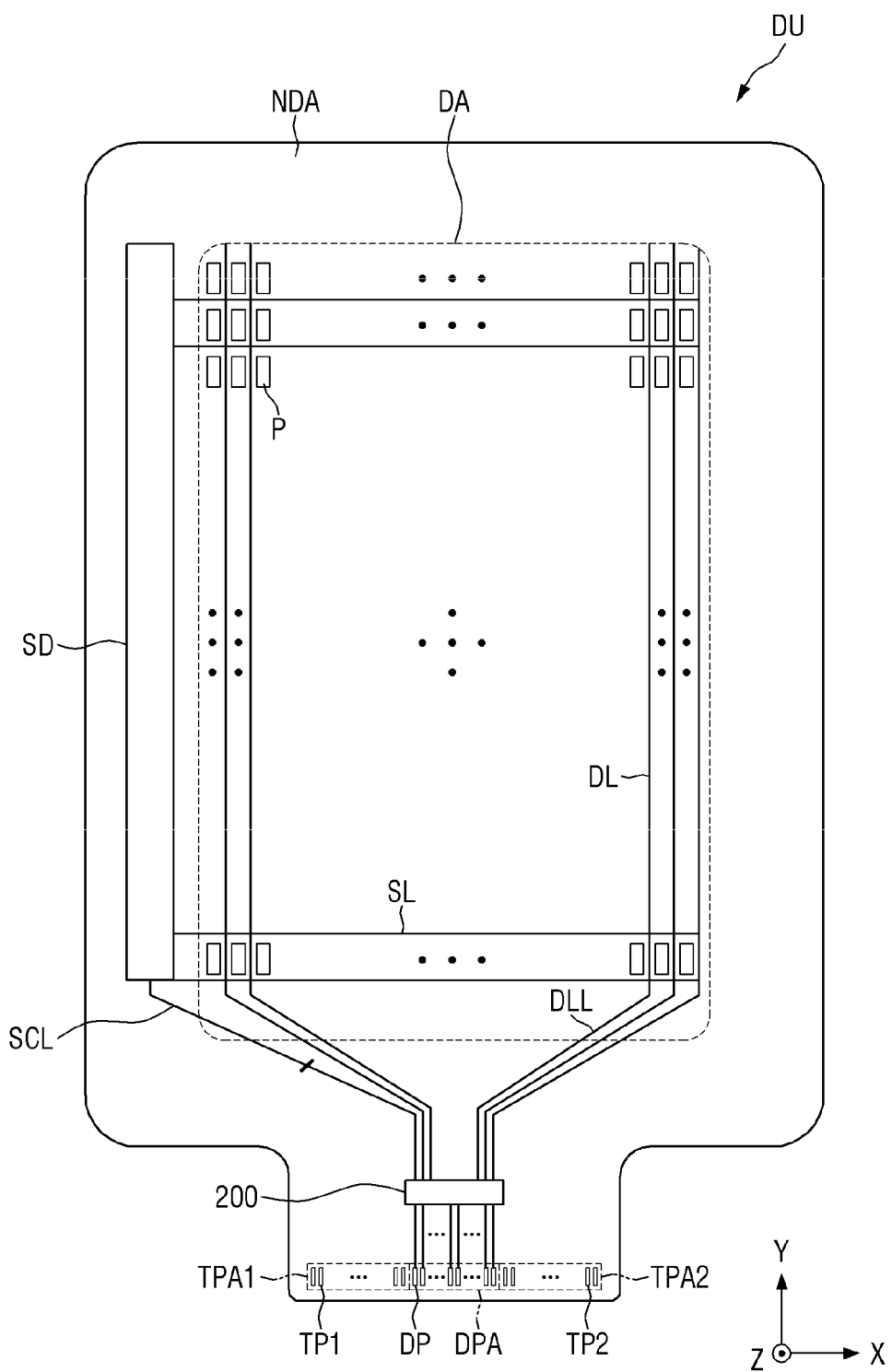
FIG. 6 is a plan view illustrating elements associated with a display unit of FIG. 5.

The thin-film transistor layer TFTL may be located on the substrate SUB. In the thin-film transistor layer TFTL, not only the thin-film transistors of the pixels, but also the scan lines, the data lines, the power supply lines, scan control lines, and routing lines, which connect the pads and the data lines, may be formed. Each of the thin-film transistors of the pixels may include a gate electrode, a semiconductor layer, a source electrode, and a drain electrode. In a case where the scan driver SD is formed in the non-display area NDA of the display panel 100, as illustrated in FIG. 6, the scan driver SD may include TFTs.

The thin-film transistor layer TFTL may be located in the display area DA and the non-display area NDA. For example, the TFTs (of the pixels), the scan lines, the data lines, and the power supply lines of the thin-film transistor layer TFTL may be located in the display area DA. The scan control lines and the link lines of the thin-film transistor layer TFTL may be located in the non-display area NDA. The thin-film transistor layer TFTL will be described later with reference to FIG. 9.

The light-emitting element layer EML may be located on the thin-film transistor layer TFTL. The light-emitting element layer EML may emit light at various luminances in accordance with driving signals transmitted thereto from the thin-film transistor layer TFTL.

The light-emitting element layer EML may include the pixels and a pixel-defining film, which define the pixels, and each of the pixels may include a first electrode, a light-emitting layer, and a second electrode. The light-emitting layer may be an organic light-emitting layer including an organic material. In this case, the light-emitting layer may include a hole transport layer, an organic emission layer, and an electron transport layer. In response to a voltage (e.g., a set or predetermined voltage) being applied to the first electrode and a cathode voltage being applied to the second electrode via the thin-film transistors of the thin-film transistor layer TFTL, holes and electrons may move to the organic emission layer through the hole transport layer and the electron transport layer, respectively, and may be combined together in the organic emission layer to emit light. The pixels of the light-emitting element layer EML may be located in the display area DA. The light-emitting element layer EML will be described later with reference to FIG. 9.

The TFE layer TFEL may be located on the light-emitting element layer EML. The TFE layer TFEL prevents the infiltration of oxygen or moisture into the light-emitting element layer EML. To this end, the TFE layer TFEL may include at least one inorganic film. The inorganic film may be a silicon nitride layer, a silicon oxynitride layer, a silicon oxide layer, a titanium oxide layer, or an aluminum oxide layer, but the present disclosure is not limited thereto. Also, the TFE layer TFEL protects the light-emitting element layer EML from foreign particles such as dust. To this end, the TFE layer TFEL may include at least one organic film. The organic film may include an acrylic resin, an epoxy resin, a phenolic resin, a polyamide resin, or a polyimide resin, but the present disclosure is not limited thereto.

The TFE layer TFEL may be located in both the display area DA and the non-display area NDA. For example, the TFE layer TFEL may be arranged to cover the light-emitting element layer EML in the display area DA and the non-display area NDA and to cover the thin-film transistor layer TFTL in the non-display area NDA. The TFE layer TFEL will be described later with reference to FIG. 9.

The sensing layer TSL may be located on the TFE layer TFEL. The sensing layer TSL, which is a layer that can sense touch input, may perform the functions of a touch member. The sensing layer TSL may include a plurality of sensing regions and sensing electrodes. Because the sensing layer TSL is arranged directly on the TFE layer TFEL, the thickness of the display device 10 can be reduced, as compared to a case where a separate touch panel including the sensing layer TSL is attached directly on the TFE layer TFEL.

Figure 7:
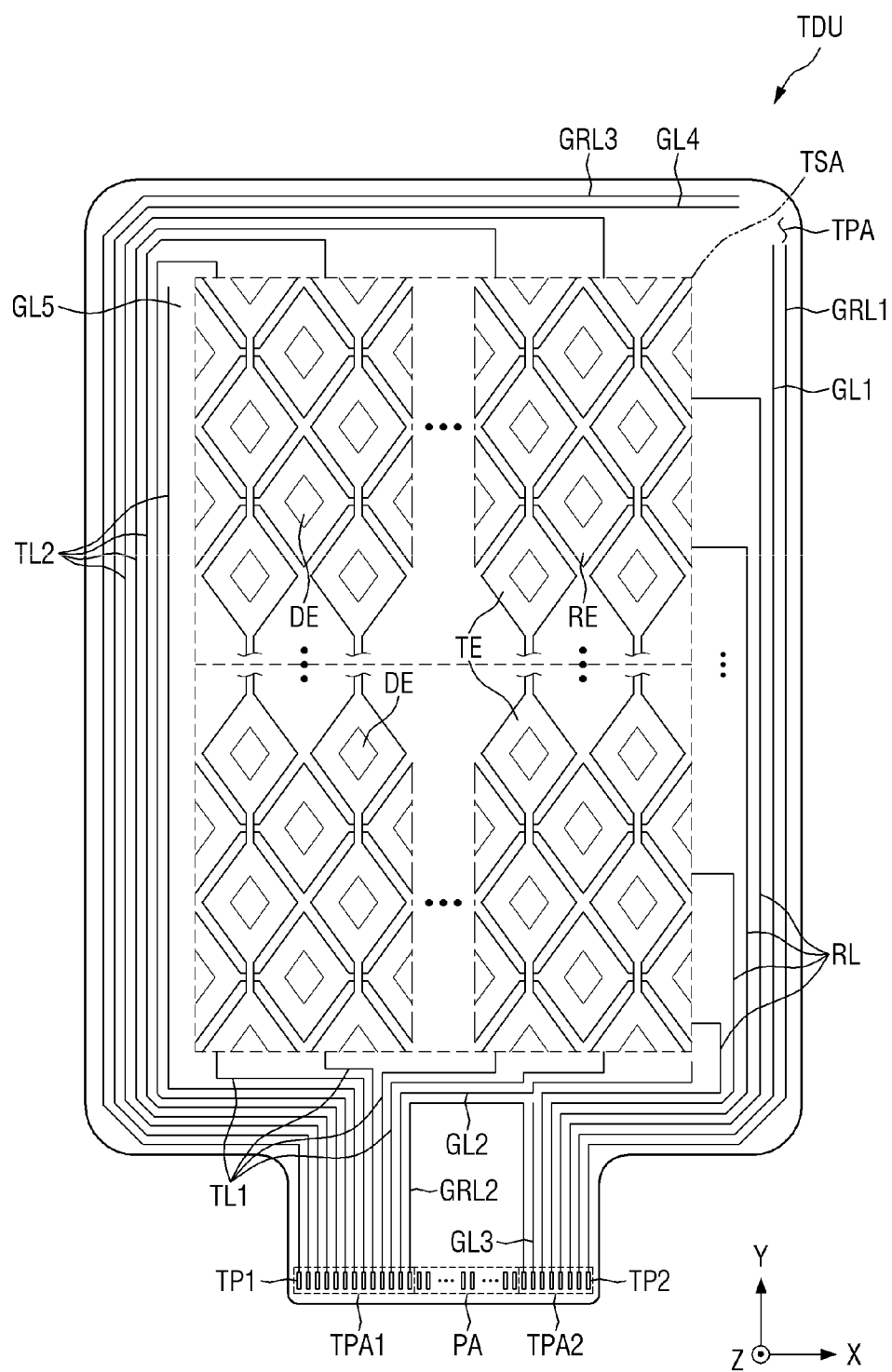
FIG. 7 is a plan view illustrating elements associated with a sensing unit of FIG. 5.

The sensing layer TSL may include sensing electrodes, which are for sensing touch input from a user in a mutual-capacitance manner, and sensing lines, which connect the pads and the sensing electrodes. The sensing electrodes of the sensing layer TSL may be located in a sensing area TSA, which overlaps with the display area DA, as illustrated in FIG. 7. The sensing lines of the sensing layer TSL may be located in a sensing peripheral area TPA, which overlaps with the non-display area NDA, as illustrated in FIG. 7.

The passivation layer 500 may be located on the sensing layer TSL. The passivation layer 500 may be located on part of the sensing layer TSL that overlaps with the flat part FA. The passivation layer 500 may not be located in parts of the sensing layer TSL that overlap with the curved parts (CA1 and CA2). Thus, the passivation layer 500 may be located on the part of the sensing layer TSL that overlaps with the flat part FA, on the inside of both the first and second bending lines BL1 and BL2. For example, a first side of the passivation layer 500 may be located on the inside of the first bending line BL1, and a second side of the passivation layer 500 may be located on the inside of the second bending line BL2. However, the present disclosure is not limited to this. Alternatively, the first and second sides of the passivation layer 500 may be aligned with the first and second bending lines BL1 and BL2, respectively.

The passivation layer 500 may be located on the sensing layer TSL to protect the sensing layer TSL. The passivation layer 500 may include an organic insulating material such as an acrylic resin, an epoxy resin, a phenolic resin, a polyamide resin, a polyimide resin, an unsaturated polyester resin, a polyphenylene resin, a polyphenylene sulfide resin, or benzocyclobutene (BCB).

The cover window 700 may be located on the passivation layer 500. The cover window 700 may be located on the flat part FA and on the curved parts (CA1 and CA2). The cover window 700 may be attached on the passivation layer 500 via an optically transparent adhesive.

According to some example embodiments, the display device 10 may further include an optical member. For example, an optical member such as a polarizing film may be interposed between the passivation layer 500 and the cover window 700.

The curved parts (CA1 and CA2), which are bent at a curvature (e.g., a set or predetermined curvature), may be damaged in the process of being bent. Because the passivation layer 500 is not located in the curved parts (CA1 and CA2), between the cover window 700 and the display panel 100, cracks that may be generated in the process of forming the curved parts (CA1 and CA2) can be prevented.

FIG. 6 is a plan view illustrating elements associated with the display unit of FIG. 5.

For convenience, FIG. 6 illustrates only pixels P, scan lines SL, data lines DL, scan control lines SCL, fan-out lines DLL, the scan driver SD, the display driving circuit 200, and display pads DP of the display unit DU.

For convenience, the size of the non-display area NDA of the display unit DU is exaggerated in FIG. 6, but the actual sizes of the display area DA and the non-display area NDA may be substantially as illustrated in FIG. 2.

Referring to FIG. 6, the scan lines SL, the data lines DL, and the pixels P are located in the display area DA. The scan lines SL may be formed in parallel to the first direction X, and the data lines DL may be formed in parallel to the second direction Y, which intersects the first direction X.

Each of the pixels P may be connected to at least one of the scan lines SL and one of the data lines DL. Each of the pixels P may include TFTs, i.e., a driving transistor and at least one switching transistor, a light-emitting element, and a capacitor. In response to scan signals being applied from the scan lines SL, the pixels P may be provided with data voltages from the data lines DL via their gate electrodes, and currents may be supplied to the light-emitting elements of the pixels P in accordance with the data voltages so that light can be emitted. Each of the light-emitting elements of the pixels P may be an organic light-emitting element having an anode electrode, an organic light-emitting layer, and a cathode electrode, but the present disclosure is not limited thereto. Each of the light-emitting elements of the pixels P may be a quantum-dot light-emitting element having an anode electrode, a quantum-dot light-emitting layer, and a cathode electrode, an inorganic light-emitting element having an anode electrode, an inorganic light-emitting layer with an inorganic semiconductor, and a cathode electrode, or a micro light-emitting element having a micro-light-emitting diode.

The scan driver SD is connected to the display driving circuit 200 via the scan control lines SCL. Thus, the scan driver SD can receive scan control signals from the display driving circuit 200. The scan driver SD generates scan signals in accordance with the scan control signals and provides the scan signals to the scan lines SL.

The scan driver SD is illustrated as being formed in the non-display area NDA, on the left side of the display area DA, but the present disclosure is not limited thereto. Alternatively, the scan driver SD may be formed in the non-display area NDA, on both the left and right sides of the display area DA.

The display driving circuit 200 is connected to the display pads DP and receives digital video data and timing signals via the display pads DP. The display driving circuit 200 converts the digital video data into analog positive/negative data voltages and provides the analog positive/negative data voltages to the data lines DL via the fan-out lines DLL. Also, the display driving circuit 200 generates scan control signals for controlling the scan driver SD and provides the scan control signals via the scan control lines SCL. Pixels P to which data voltages are to be provided are selected by scan signals from the scan driver SD, and data voltages are provided to the selected pixels P. The display driving circuit 200 may be formed as an IC and may be mounted on the substrate SUB in a COG or COP manner or through ultrasonic bonding, but the present disclosure is not limited thereto. For example, the display driving circuit 200 may be mounted on the circuit board 300.

Referring to FIG. 6, the display panel 100 may include the display pads DP, which are electrically connected to the display driving circuit 200, and sensing pads (TP1 and TP2), which are electrically connected to the sensing lines. The display pad area DPA, in which the display pads DP are arranged, may be located between a first sensing pad area TPA1 where first sensing pads TP1 are located and a second sensing pad area TPA2 where second sensing pads TP2 are located. As illustrated in FIG. 6, the display pad area DPA may be located in the middle at one end of the protruding area PA, the first sensing pad area TPA1 may be arranged to the left of the display pad area DPA, and the second sensing pad area TPA2 may be located to the right of the display pad area DPA.

The circuit board 300 may be attached on the display pads DP and the sensing pads (TP1 and TP2) via an anisotropic conductive film. As a result, the lead lines of the circuit board 300 may be electrically connected to the display pads DP and the sensing pads (TP1 and TP2). The circuit board 300 may be a flexible printed circuit board, a printed circuit board, or a flexible film such as a chip-on-film.

According to some example embodiments, a touch driving circuit may be connected to the sensing electrodes of the sensing unit TDU of the display panel 100. The touch driving circuit applies driving signals to the sensing electrodes and measures the mutual capacitances of the sensing electrodes. The driving signals may be signals with multiple driving pulses. The touch driving circuit may calculate the touch coordinates of touch input based on the mutual capacitances of the sensing electrodes.

The touch driving circuit may be located on the circuit board 300. The touch driving circuit may be formed as an IC and may be mounted on the circuit board 300.

FIG. 7 is a plan view illustrating elements associated with the sensing unit of FIG. 5.

For convenience, FIG. 7 illustrates only sensing electrodes (RE and TE), conductive patterns DE, sensing lines (TL1, TL2, and RL), and the sensing pads (TP1 and TP2).

Referring to FIG. 7, the sensing unit TDU includes the sensing area TSA, which is for sensing touch input from the user, and the sensing peripheral area TPA, which is arranged on the periphery of the sensing area TSA.

The sensing area TSA may overlap with the display area DA of the display unit DU, and the sensing peripheral area TPA may overlap with the non-display area NDA of the display unit DU. For convenience, in FIG. 7, the shapes of the elements of the sensing unit TDU are generally simplified, and the size of the sensing peripheral area TPA is exaggerated. However, the actual sizes of the sensing area TSA and the sensing peripheral area TPA may be substantially as illustrated in FIG. 2. The sensing peripheral area TPA will hereinafter be referred to simply as the non-display area NDA, unless otherwise noted.

The sensing electrodes (RE and TE) may be located in the sensing area TSA. The sensing electrodes (RE and TE) may include first sensing electrodes RE and second sensing electrodes TE. According to some example embodiments, as illustrated in FIG. 7, the first sensing electrodes RE may be sensing electrodes, and the second sensing electrodes TE may be driving electrodes.

The first sensing electrodes RE may be arranged in rows along the first direction X. First sensing electrodes RE that belong to the same row in the first direction X may be electrically connected to one another. The second sensing electrodes TE may be arranged in columns along the second direction Y. Second sensing electrodes TE that belong to the same column in the second direction Y may be electrically connected to one another.

Pairs of adjacent second sensing electrodes TE in the second direction Y may be electrically connected via connecting electrodes in order to prevent the first sensing electrodes RE and the second sensing electrodes TE from being short-circuited at the intersections between the first sensing electrodes RE and the second sensing electrodes TE. In this case, the first sensing electrodes RE and the second sensing electrodes TE may be located in one layer, and the connecting electrodes may be located in a different layer from the first sensing electrodes RE and the second sensing electrodes TE. Also, the first sensing electrodes RE, which are connected to one another in the first direction X, and the second sensing electrodes TE, which are connected to one another in the second direction Y, may be electrically insulated from each other.

FIG. 7 illustrates that the first sensing electrodes RE and the second sensing electrodes TE have a rhombus shape in a plan view, but the planar shape of the first sensing electrodes RE and the second sensing electrodes TE is not particularly limited.

The size of the first sensing electrodes RE and the size of the second sensing electrodes RE may be substantially the same.

The conductive patterns DE may be electrically isolated from the first sensing electrodes RE and the second sensing electrodes TE. That is, the conductive patterns DE may be arranged to be spaced apart from the first sensing electrodes RE and the second sensing electrodes TE. The conductive patterns DE may be arranged to be surrounded by the first sensing electrodes RE and the second sensing electrodes TE.

Due to the presence of the conductive patterns DE, the parasitic capacitances between the second electrode of the light-emitting element layer EML and the first sensing electrodes RE (or the second sensing electrodes TE) can be reduced. As a result, the speed at which the mutual capacitances between the first sensing electrodes RE and the second sensing electrodes TE are charged can be improved.

The sensing pads (TP1 and TP2), the sensing lines (TL1, TL2, and RL), guard lines (GL1, GL2, GL3, GL4, and GL5), and ground lines (CRL1, CRL2, and CRL3) may be located in the sensing peripheral area TPA.

The sensing pads (TP1 and TP2) may be arranged on one side of the display panel 100. According to some example embodiments, a touch circuit board may be attached on the sensing pads (TP1 and TP2) via an anisotropic conductive film. As a result, the sensing pads (TP1 and TP2) can be electrically connected to the touch circuit board. The sensing pads (TP1 and TP2) may include the first sensing pads TP1 and the second sensing pads TP2.

The sensing lines (TL1, TL2, and RL) may include first sensing lines RL, second sensing lines TL1, and third sensing lines TL2.

First ends of the first sensing lines RL may be connected to first ends of rows of first sensing electrodes RE. That is, the first ends of the first sensing lines RL may be connected to first sensing electrodes RE on the right side of the sensing area TSA. The right side of the sensing area TSA, which is opposite to the left side of the sensing area TSA, may be a side of the sensing area TSA located, in the second direction Y, between the upper and lower sides of the sensing area TSA. Second ends of the first sensing lines RL may be connected to the second sensing pads TP2 in a touch pad area. That is, the first sensing lines RL may connect the first sensing electrodes RE and the second sensing pads TP2.

First ends of the second sensing lines TL1 may be connected to first ends of columns of second sensing electrodes TE. That is, the first ends of the second sensing lines TL1 may be connected to second sensing electrodes TE on the lower side of the sensing area TSA. The lower side of the sensing area TSA may be the closest side of the sensing area TSA to the touch pad area where the first sensing pads TP1 and the second sensing pads TP2 are located. Second ends of the second sensing lines TL1 may be connected to some of the first sensing pads TP1. That is, the second sensing lines TL1 may connect the first ends of the columns of second sensing electrodes TE and the first sensing pads TP1.

First ends of the third sensing lines TL2 may be connected to second ends of the columns of second sensing electrodes TE. That is, the first ends of the third sensing lines TL2 may be connected to second sensing electrodes TE on the upper side of the sensing area TSA. The upper side of the sensing area TSA, which is opposite to the lower side of the sensing area TSA, may be the farthest side of the sensing area TSA from the touch pad area where the first sensing pads TP1 and the second sensing pads TP2 are located. The third sensing lines TL2 may be connected to the second sensing electrodes TE on the upper side of the sensing area TSA by passing through the lower and left sides of the sensing area TSA. Second ends of the third sensing lines TL2 may be connected to some of the first sensing pads TP1. That is, the third sensing lines TL2 may connect the second ends of the columns of third sensing electrodes TE2 and the first sensing pads TP1.

The first sensing electrodes RE and the second sensing electrodes TE may be driven in a mutual-capacitance manner or in a self-capacitance manner.

First, in a case where the first sensing electrodes RE and the second sensing electrodes TE are driven in a mutual-capacitance manner, touch driving signals are provided to the second sensing electrodes TE via the second sensing lines TL1 and the third sensing lines TL2 so that mutual capacitances at the intersections between the first sensing electrodes RE and the second sensing electrodes TE can be charged. Thereafter, variations in the mutual capacitances are measured via the first sensing electrodes RE, and the presence of touch input is determined based on the measured variations. The touch driving signals may be signals with multiple touch driving pulses.

Second, in a case where the first sensing electrodes RE and the second sensing electrodes TE are driven in a self-capacitance manner, the touch driving signals are provided to both the first sensing electrodes RE and the second sensing electrodes TE via the first sensing lines RL, the second sensing linens TL1, and the third sensing lines TL2 so that self-capacitances of the first sensing electrodes RE and of the second sensing electrodes TE can be charged. Thereafter, variations in the self-capacitances are measured, and the presence of touch input is determined based on the measured variations.

For convenience, the first sensing electrodes RE and the second sensing electrodes TE will hereinafter be described as being driven in a mutual-capacitance manner in which a plurality of touch driving pulses are applied to the second sensing electrodes TE are applied and mutual capacitance variations are measured via the first sensing lines RL, which are connected to the first sensing electrodes RE. In this case, the first sensing electrodes RE may function as sensing electrodes, the second sensing electrodes TE may function as driving electrodes, the first sensing lines RL may function as sensing lines, and the second sensing lines TL1 and the third sensing lines TL2 may function as driving lines.

The guard lines (GL1, GL2, GL3, GL4, and GL5) and the ground lines (GRL1, GRL2, and GRL3) may be further located on the outside of the sensing lines (TL1, TL2, and RL). The guard lines (GL1, GL2, GL3, GL4, and GL5) may be located on the outside of outermost sensing lines (TL1, TL2, and RL), and the ground lines (GRL1, GRL2, and GRL3) may be located on the outside of the guard lines (GL1, GL2, GL3, GL4, and GL5). A ground voltage may be applied to the ground lines (GRL1, GRL2, and GRL3). Thus, when static electricity is applied from the outside, the static electricity may be released to the ground lines (GRL1, GRL2, and GRL3). The guard lines (GL1, GL2, GL3, GL4, and GL5) may be located between the outermost sensing lines (TL1, TL2, and RL) and the ground lines (GRL1, GRL2, and GRL3). Because the guard lines (GL1, GL2, GL3, GL4, and GL5) are located between the outermost sensing lines (TL1, TL2, and RL) and the ground lines (GRL1, GRL2, and GRL3), the influence of voltage variations in the ground lines (GRL1, GRL2, and GRL3) on the sensing lines (TL1, TL2, and RL) can be minimized or reduced.

In a case where the sensing electrodes (TE and RE) are driven in a mutual-capacitance manner, a ground voltage may be applied to the ground lines (GRL1, GRL2, and GRL3). Also, in a case where the sensing electrodes (TE and RE) are driven in a self-capacitance manner, the same driving signals as those applied to the sensing lines (TL1, TL2, and RL) may be applied to the guard lines (GL1, GL2, GL3, GL4, and GL5).

The guard lines (GL1, GL2, GL3, GL4, and GL5) may include first, second, third, fourth, and fifth guard lines GL1, GL2, GL3, GL4, and GL5. For example, the first guard line GL1 may be located to the right of the first sensing lines RL. The second guard line GL2 may be located between the first sensing lines RL and the second sensing lines TL1. The third guard line GL3 may be located between a second ground line GRL2 and the first sensing lines RL. The fourth guard line GL4 may be arranged to surround the left, upper, and lower sides of the sensing area TSA. The fifth guard line GL5 may be arranged to the right of the third sensing lines TL2.

The ground lines (GRL1, GRL2, and GRL3) may include a first ground line GRL1, the second ground line GRL2, and a third ground line GRL3. Specifically, the first ground line GRL1 may be arranged to the right of the first guard line GL1. The second ground line GRL2 may be connected to the leftmost second sensing pad TP2. The third ground line GRL3 may be connected to the rightmost first sensing pad TP1. The second ground line GRL2 may be arranged to the left of the third guard line GL3, and the third ground line GRL3 may be arranged to the right of the second guard line GL2. The second and third ground lines GRL2 and GRL3 may be electrically connected.

The first and third ground lines GRL1 and GRL3 may be located on the leftmost, uppermost, and rightmost sides of the display panel 100. The second ground line GRL2 may be located on the lower side of the display panel 100. As a result, the sensing area TSA, the first sensing lines RL, the second sensing lines TL1, and the third sensing lines TL2 may be surrounded by the first, second, and third ground lines GRL1, GRL2, and GRL3. Thus, static electricity applied from the outside may be released to the first, second, and third ground lines GRL1, GRL2, and GRL3. That is, the sensing area TSA, the first sensing lines RL, the second sensing lines TL1, and the third sensing lines TL2 can be protected from static electricity.

The first guard line GL1 may minimize the influence of a voltage variation in the first ground line GRL1 on the first sensing lines RL. The second guard line GL2 may minimize the influence of the first sensing lines RL and the second sensing lines TL1 on each other. The third guard line GL3 may minimize a voltage variation in the second ground line GRL2 on the first sensing lines RL. The fourth guard line GL4 may minimize a voltage variation in the third ground line GRL3 on the second sensing lines TL2. The fifth guard line GL5 may minimize voltage variations on the sensing area TSA, the second sensing lines TL1, and the third sensing lines TL2.

Figure 8:
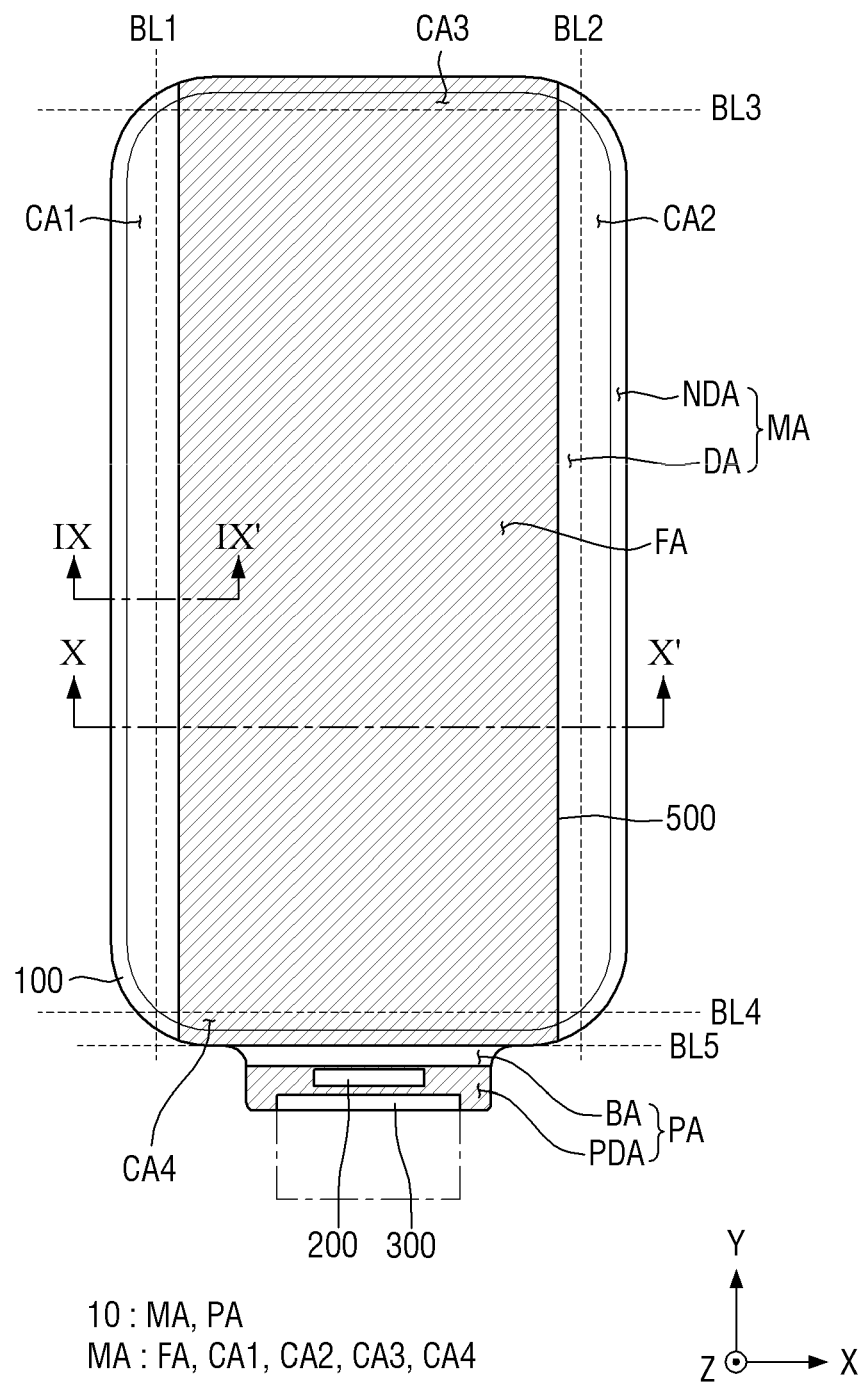
FIG. 8 is a layout view illustrating the arrangement of the display panel and the passivation layer of FIG. 4.
Figure 9:
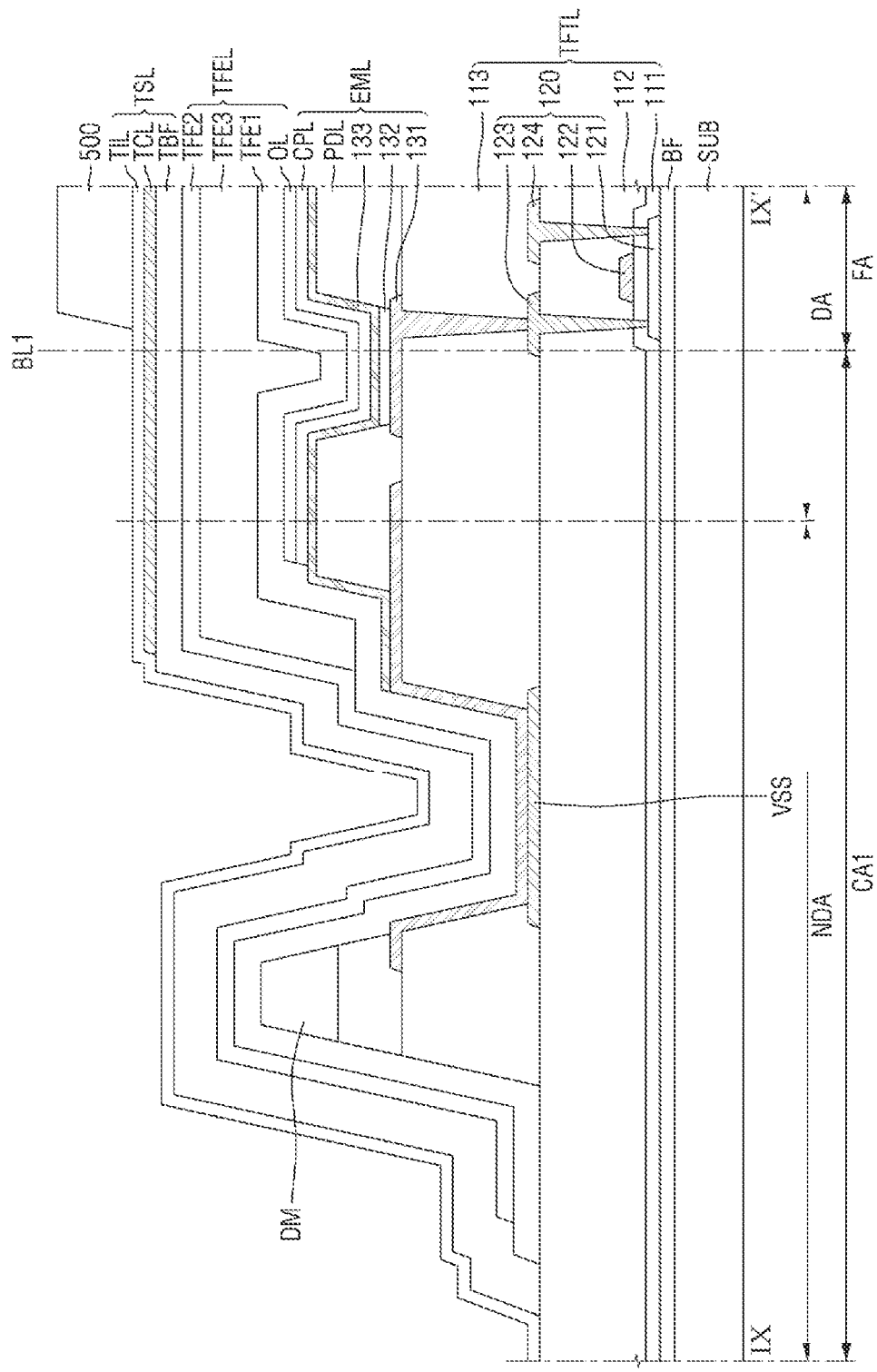
FIG. 9 is a cross-sectional view taken along the line IX-IX' of FIG. 8.

FIG. 8 is a layout view illustrating the arrangement of the display panel and the passivation layer of FIG. 4. FIG. 9 is a cross-sectional view taken along line IX-IX' of FIG. 8.

Referring to FIG. 8, the passivation layer 500 may be located in the main area MA and the pad area PDA of the display panel 100.

For example, the passivation layer 500 may be located in the entire main area MA except for the first and second curved parts CA1 and CA2. That is, the passivation layer 500 may be located in the entire flat part FA of the main area MA, may be located in the third curved part CA3 by extending from the flat part FA in the second direction Y, and may be located in the fourth curved part CA4 by extending from the flat part FA in the opposite direction of the second direction Y.

The passivation layer 500 may not be located in the bending area BA of the protruding area PA. The passivation layer 500 may be located in the pad area PDA of the protruding area PA, but not in the region where the display driving circuit 200 and the circuit board 300 are located.

The cross-sectional structures of the display panel 100 and the passivation layer 500, which is located on the display panel 100, will hereinafter be described with reference to FIGS. 5, 8, and 9.

As already mentioned above, the display device 10 may include the display panel 100 and the passivation layer 500, which is located on the sensing layer TSL of the display panel 100.

The display panel 100 may include the substrate SUB, the thin-film transistor layer TFTL, the light-emitting element layer EML, the TFE layer TFEL, and the sensing layer TSL.

A buffer film BF may be formed on the surface of the substrate SUB. The buffer film BF may be formed on the surface of the substrate SUB to protect a TFT 120 and a light-emitting layer 132 of the light-emitting element layer EML from moisture infiltrated through the substrate SUB, which is vulnerable to moisture. The buffer film BF may consist of a plurality of inorganic films that are alternately stacked. For example, the buffer film BF may be formed as a multilayer film in which at least one of a silicon oxide (SiOx) film, a silicon nitride (SiNx) film, or a SiON film is alternately stacked. The buffer film BF may not be provided.

The thin-film transi layer TFTL may be located on the buffer film BF. The thin-film transistor layer TFTL may be located in the display area DA and the non-display area NDA.

The thin-film transistor layer TFTL may include a semiconductor layer 121, a first insulating layer 111, a first conductive layer 122, a second insulating layer 112, a second conductive layer (123, 124, and VSS), and a third insulating layer 113. Each of the layers of the thin-film transistor layer TFTL may be formed as a single-layer film or as a stack of multiple films, and other layers may be further located between the layers of the thin-film transistor layer TFTL. Also, the thin-film transistor layer TFTL may include the TFT 120, which includes the semiconductor layer 121, a gate electrode 122, a drain electrode 123, and a source electrode 124. For convenience, the terms "the first conductive layer 122" and "the gate electrode 122" will hereinafter be used interchangeably.

The semiconductor layer 121 is located on the buffer film BF. The semiconductor layer 121 forms the channel of the thin-film transistor 120. The semiconductor layer 121 may include polycrystalline silicon, which may be formed by crystallizing amorphous silicon.

In a case where the semiconductor layer 121 is formed of polycrystalline silicon and is doped with ions, the semiconductor layer 121 may have conductivity. As a result, the semiconductor layer 121 may include not only a channel region, but also source and drain regions, of the TFT 120. The source and drain regions may be connected to both sides of the channel region.

Alternatively, the semiconductor layer 121 may include monocrystalline silicon, low-temperature polycrystalline silicon, amorphous silicon, or an oxide semiconductor. The oxide semiconductor may include, for example, a binary compound (ABx), a tertiary compound (ABxCy), or a quaternary compound (ABxCyDz) containing indium (In), zinc (Zn), gallium (Ga), tin (Sn), titanium (Ti), aluminum (Al), hafnium (Hf), zirconium (Zr), or magnesium (Mg). For example, the semiconductor layer 121 may include indium tin zinc oxide (ITZO) or indium gallium zinc oxide (IGZO).

The first insulating layer 111 is located on the semiconductor layer 121. The first insulating layer 111 may be located on the entire surface of the substrate SUB. The first insulating layer 111 may be a gate insulating film having a gate insulation function. The first insulating layer 111 may include a silicon compound or a metal oxide. For example, the first insulating layer 111 may include silicon oxide, silicon nitride, silicon oxynitride, aluminum oxide, tantalum oxide, hafnium oxide, zirconium oxide, or titanium oxide. The first insulating layer 111 may be a single-layer film or a multilayer film consisting of a stack of different materials.

The first conductive layer 122 is located on the first insulating layer 111. The first conductive layer 122 may be the gate electrode 122 of the TFT 120. The first conductive layer 122 may include at least one metal selected from among molybdenum (Mo), Al, platinum (Pt), palladium (Pd), silver (Ag), Mg, gold (Au), nickel (Ni), neodymium (Nd), iridium (Ir), chromium (Cr), calcium (Ca), Ti, Ta, tungsten (W), and copper (Cu). The first conductive layer 122 may be a single-layer film or a multilayer film.

The second insulating layer 112 is located on the first conductive layer 122. The second insulating layer 112 may be located on the entire surface of the substrate SUB. The second insulating layer 122 insulates the first conductive layer 122 and the second conductive layer (123, 124, and VSS).

The second insulating layer 112 may be an interlayer insulating film. The second insulating layer 112 may include the same material as the first insulating layer 111 or may include at least one selected from among the above-mentioned example materials of the first insulating material 111.

The second conductive layer (123, 124, and VSS) is located on the second insulating layer 112. The second conductive layer (123, 124, and VSS) may include signal wires, a power supply line VSS, the drain electrode 123, and the source electrode 124. The drain electrode 123 and the source electrode 124 may be connected to the drain region and the source region, respectively, of the semiconductor layer 121 through contact holes that penetrate the first and second insulating layers 111 and 112.

The power supply line VSS, the drain electrode 123, and the source electrode 124 may include at least one metal selected from among Al, Mo, Pt, Pd, Ag, Mg, Au, Ni, Nd, Ir, Cr, Ca, Ti, Ta, W, and Cu. The power supply line VSS, the drain electrode 123, and the source electrode 124 may be single-layer films or multilayer films. For example, the power supply line VSS, the drain electrode 123, and the source electrode 124 may be formed of a stack of, for example, Ti/Al/Ti, Mo/Al/Mo, Mo/AlGe/Mo, or Ti/Cu.

The third insulating layer 113 is located on the second conductive layer (123, 124, and VSS) and on the second insulating layer 112. The third insulating layer 113 may be a via layer. The third insulating layer 113 may planarize a height difference generated by the TFT 120.

The third insulating layer 113 may include an organic insulating material such as an acrylic resin, an epoxy resin, a phenolic resin, a polyamide resin, a polyimide resin, an unsaturated polyester resin, a polyphenylene resin, a polyphenylene sulfide resin, or BCB.

The light-emitting element layer EML may be located on the thin-film transistor layer TFTL. The light-emitting element layer EML may be located in the display area DA, but the present disclosure is not limited thereto. Alternatively, the light-emitting element layer EML may also be located in the non-display area NDA.

The light-emitting element layer EML may include a first electrode 131, a pixel-defining film PDL, which includes an opening that exposes the first electrode 131, the light-emitting layer 132, which is located in the opening of the pixel-defining film PDL, a second electrode 133, which is located on the light-emitting layer 132 and the pixel-defining film PDL, and a capping layer CPL.

The first electrode 131 is located on the third insulating layer 113. The first electrode 131 may be connected to the drain electrode 123 of the TFT 120 through a contact hole that penetrates the third insulating layer 113. The anode electrode of a pixel may be formed by the first electrode 131. The anode electrode of the pixel may be electrically connected to the drain electrode 123 through the contact hole that penetrates the third insulating layer 113.

In a top emission structure where light is emitted toward the second electrode 133 from the light-emitting layer 132, the first electrode 131 may be formed of a metallic material with high reflectance such as a stack of Al and Ti (e.g., Ti/Al/Ti), a stack of Al and indium tin oxide (ITO) (e.g., ITO/Al/ITO), a silver-palladium-copper (APC) alloy, or a stack of an APC alloy and ITO (e.g., ITO/APC/ITO).

In a bottom emission structure where light is emitted toward the first electrode 131 from the light-emitting layer 132, the first electrode 131 may be formed of a transparent conductive oxide (TCO) such as ITO or indium zinc oxide (IZO) or a semitransparent metallic material such as Mg, Ag, or an alloy of Mg and Ag. For example, in a case where the first electrode 131 is formed of a semitransparent metallic material, emission efficiency can be improved due to microcavities.

The pixel-defining film PDL may be formed to define the first electrode 131 over the third insulating layer 113 to define a pixel. That is, the pixel-defining film PDL may include the opening that exposes the first electrode 131. The opening may define the emission area of a pixel. The pixel-defining film PDL may be formed to cover the edges of the first electrode 131.

The pixel-defining film PDL may include an inorganic insulating material such as silicon oxide, silicon nitride, silicon oxynitride, hafnium oxide, aluminum oxide, titanium oxide, tantalum oxide, or zinc oxide or an organic insulating material such as an acrylic resin, an epoxy resin, a phenolic resin, a polyamide resin, a polyimide resin, an unsaturated polyester resin, a polyphenylene resin, a polyphenylene sulfide resin, or BCB. The pixel-defining film PDL may be a single-layer film or a multilayer film consisting of a stack of different materials.

Each pixel may refer to a region where the first electrode 131, the light-emitting layer 132, and the second electrode 133 are sequentially stacked so that holes from the first electrode 131 and electrons from the second electrode 133 are combined together in the light-emitting layer 132 to emit light.

The light-emitting layer 132 is located on the first electrode 131, which is defined by the pixel-defining film PDL. That is, the light-emitting layer 132 is located in the opening of the pixel-defining film PDL. The light-emitting layer 132 may be an organic light-emitting layer including an organic material and emitting light of a color (e.g., a set or predetermined color). In a case where the light-emitting layer 132 is a white light-emitting layer that emits white light, the light-emitting layer 132 may be a common layer formed in common for all subpixels. In this case, the light-emitting layer 132 may be formed to have a tandem structure having at least two stacks, and each of the stacks may include a hole transport layer, at least one emission layer, and an electron transport layer.

Also, charge generation layers may be formed between the stacks. The charge generation layers may include an n-type charge generation layer, which is located adjacent to the lower stack, and a p-type charge generation layer, which is formed on the n-type charge generation layer and is located adjacent to the upper stack. The n-type charge generation layer injects electrons into the lower stack, and the p-type charge generation layer injects holes into the upper stack. The n-type charge generation layer may be an organic layer obtained by doping an organic host material with electron transporting capability with an alkali metal such as lithium (Li), sodium (Na), potassium (K), or cesium (Cs) or an alkali earth metal such as Mg, strontium (Sr), barium (Ba), or radium (Ra). The p-type charge generation layer may be an organic layer obtained by doping an organic host material with hole transporting capability with a dopant.

The second electrode 133 is located on the light-emitting layer 132 and on the pixel-defining film PDL. A cathode electrode may consist of the second electrode 133. The cathode electrode may be located in the entire display area DA. The sides of the second electrode 133 may be located in the non-display area NDA.

In a top emission structure, the second electrode 133 may be formed of a TCO such as ITO or IZO or a semitransparent metallic material such as Mg, Ag, or an alloy of Mg and Ag. For example, in a case where the second electrode 133 is formed of a semitransparent metallic material, emission efficiency can be improved due to micro-cavities.

In a bottom emission structure, the second electrode 133 may be formed of a metallic material with high reflectance such as a stack of Al and Ti (e.g., Ti/Al/Ti), a stack of Al and ITO (e.g., ITO/Al/ITO), an APC alloy, or a stack of an APC alloy and ITO (e.g., ITO/APC/ITO).

The capping layer CPL is located on the second electrode 133. The capping layer CPL may be formed in and across the display area DA and the non-display area NDA. The sides of the capping layer CPL may be located in the non-display area NDA. The sides of the capping layer CPL may be located on the inside of the sides of the second electrode 133. The expression "one element being located on the inside of another element", as used herein, means that the former is located closer than the latter to the center of the display area DA, and the expression "an element being located on the outside of another element", as used herein, means that the former is located closer than the latter to the outermost edges of the substrate SUB. Accordingly, the capping layer CPL may expose part of the second electrode 133, including the sides of the second electrode 133.

The capping layer CPL may protect a light-emitting element. Also, the capping layer CPL may effectively guide light provided by the light-emitting layer 132. The capping layer CPL may include at least one material selected from the group consisting of a-NPD, NPB, TPD, m-MTDATA, Alq$_3$, and CuPc.

The TFE layer TFEL may be located on the light-emitting element layer EML. The TFE layer TFEL may be located in both the display area DA and the non-display area NDA. For example, the TFE layer TFEL may cover the light-emitting element layer EML in both the display area DA and the non-display area NDA. Also, the TFE layer TFEL may cover part of the Thin-film transistor layer TFTL in the non-display area NDA that does not overlap with the light-emitting element layer EML.

The TFE layer TFEL may prevent the infiltration of oxygen or moisture into the light-emitting element layer EML. Also, the TFE layer TFEL may protect the light-emitting element layer EML from foreign particles such as dust.

The TFE layer TFEL may include a first encapsulation layer TFE1, a second encapsulation layer TFE2, and a third encapsulation layer TFE3, which is located between the first and second encapsulation layers TFE1 and TFE2. The first, second, and third encapsulation layers TFE1, TFE2, and TFE3 may be formed as single-layer films or as multilayer films including stacks of multiple films. Other layers may be further located between the first, second, and third encapsulation layers TFE1, TFE2, and TFE3.

The capping layer CPL may be located on the first encapsulation layer TFE1. The first encapsulation layer TFE1 may be located on the entire surface of the substrate SUB. The sides of the first encapsulation layer TFE1 may be located in the non-display area NDA. The sides of the first encapsulation layer TFE1 may be located on the outside of the second electrode 133. Accordingly, the first encapsulation layer TFE1 may be in direct contact with part of the surface of the second electrode 133 exposed by the capping layer CPL. Also, the first encapsulation layer TFE1 may be in direct contact with the surface of the second insulating layer 112.

The first encapsulation layer TFE1 may be an inorganic film. The inorganic film may include silicon nitride, aluminum nitride, zirconium nitride, titanium nitride, hafnium nitride, tantalum nitride, silicon oxide, aluminum oxide, or titanium oxide, but the present disclosure is not limited thereto.

The second encapsulation layer TFE2 may be located on the first encapsulation layer TFE1. The second encapsulation layer TFE2 may be located on the entire surface of the substrate SUB. The sides of the second encapsulation layer TFE2 may be located in the non-display area NDA. The sides of the second encapsulation layer TFE2 may be located between the sides of the first encapsulation layer TFE1 and the sides of the second electrode 133. The surface of the second encapsulation layer TFE2 may be in direct contact with the surface of the first encapsulation layer TFE1.

The second encapsulation layer TFE2 may be an inorganic film. The inorganic film may include silicon nitride, aluminum nitride, zirconium nitride, titanium nitride, hafnium nitride, tantalum nitride, silicon oxide, aluminum oxide, or titanium oxide, but the present disclosure is not limited thereto. The first and second encapsulation layers TFE1 and TFE2 may be formed of the same material, but the present disclosure is not limited thereto. Alternatively, the first and second encapsulation layers TFE1 and TFE2 may be formed of different materials.

The third encapsulation layer TFE3 is interposed between the first and second encapsulation layers TFE1 and TFE2. The sides of the third encapsulation layer TFE3 may be located on the inside of the sides of the first encapsulation layer TFE1 and/or on the inside of the sides of the second encapsulation layer TFE2. Accordingly, the sides of the third encapsulation layer TFE3 may be covered by the second encapsulation layer TFE2. The top surface of the third encapsulation layer TFE3 may be in direct contact with the second encapsulation layer TFE2, and the bottom surface of the third encapsulation layer TFE3 may be in direct contact with the first encapsulation layer TFE1. That is, the third encapsulation layer TFE3 may be arranged to be sealed by the first encapsulation layer TFE1 and/or the second encapsulation layer TFE2. In this case, the infiltration of moisture through the third encapsulation layer TFE3 can be blocked.

The third encapsulation layer TFE3 may planarize a height difference formed by the pixel-defining film PDL. The thickness of the third encapsulation layer TFE3 may be greater than the thickness of the first encapsulation layer TFE1 and/or the thickness of the second encapsulation layer TFE2. The third encapsulation layer TFE3 may be formed to a sufficient thickness to prevent foreign particles from infiltrating into the light-emitting element layer EML through the TFE layer TFEL.

The third encapsulation layer TFE3 may be an organic film. The organic film may include an acrylic resin, an epoxy resin, a phenolic resin, a polyamide resin, or a polyimide resin, but the present disclosure is not limited thereto.

The TFE layer TFEL may further include an optical control layer OL. The optical control layer OL may be located between the light-emitting element layer EML and the first encapsulation layer TFE1. One surface of the optical control layer OL may be in contact with the capping layer CPL, and the other surface of the optical control layer OL may be in direct contact with the first encapsulation layer TFE1.

The optical control layer OL may improve efficiency by minimizing the absorption of light, generated by the light-emitting layer 132 and passing through the second electrode 133. The optical control layer OL may have a higher refractive index than the second electrode 133. Accordingly, the extraction of light can be improved due to the difference between the refractive index of the optical control layer OL and the refractive index of the second electrode 133. The optical control layer OL may include LiF, $MgF_2$, or $CaF_2$.

The sensing layer TSL may be located on the TFE layer TFEL. Because the sensing layer TSL is attached directly on the TFE layer TFEL, the thickness of the display device 10 can be reduced, as compared to a case where a separate touch panel including the sensing layer TSL is attached directly on the TFE layer TFEL.

The sensing layer TSL may include a sensing buffer layer TBF, a sensing conductive layer TCL, and a sensing insulating layer TIL. The sensing layer TSL may detect touch input from the user in a self-capacitance or mutual-capacitance manner.

The sensing buffer layer TBF, the sensing conductive layer TCL, and the sensing insulating layer TIL may be single-layer films or multilayer films including stacks of multiple films. Other layers may be further located between the sensing buffer layer TBF, the sensing conductive layer TCL, and the sensing insulating layer TIL.

The sensing buffer layer TBF may be located on the second encapsulation layer TFE2. The sensing buffer layer TBF may prevent cracks and may improve sensing sensitivity. Also, the sensing buffer layer TBF may prevent the infiltration of oxygen or moisture into the light-emitting element layer EML, together with the TFE layer TFEL. The sensing buffer layer TBF may include the same material as the first encapsulation layer TFE1 or may include at least one selected from among the above-mentioned example materials of the first encapsulation layer TFE1.

The sides of the sensing buffer layer TBF may be located on the outside of the sides of the first encapsulation layer TFE1 and/or on the outside of the sides of the second encapsulation layer TFE2. Accordingly, the sensing buffer layer TBF may cover the sides of the first encapsulation layer TFE1 and the sides of the second encapsulation layer TFE2. That is, the first and second encapsulation layers TFE1 and TFE2 may be sealed by the sensing buffer layer TBF. In this case, the infiltration of moisture can be further blocked. Also, because the sides of the sensing buffer layer TBF are located on the outside of the sides of the first encapsulation layer TFE1, the sensing buffer layer TBF may be in direct contact with the second insulating layer 112. Because a sufficient contact area can be secured between the sensing buffer layer TBF and the second insulating layer 112, the bonding between the sensing buffer layer TBF and the substrate SUB can be stably maintained.

The ends of the sensing buffer layer TBF may be located on the outside of the ends of the TFE layer TFEL. For example, the ends of the sensing buffer layer TBF may be located on the outside of the second encapsulation layer TFE2. The top surface and the sides of each of the first and second encapsulation layers TFE1 and TFE2 in the non-display area NDA may be in direct contact with the sensing buffer layer TBF. Thus, the sensing buffer layer TBF may seal the first and second encapsulation layers TFE1 and TFE2. Accordingly, the infiltration of moisture can be further blocked.

The sensing conductive layer TCL is located on the sensing buffer layer TBF. The sensing conductive layer TCL may include the sensing electrodes, which are for detecting touch input from the user, and the sensing lines, which connect the pads and the sensing electrodes. The sensing conductive layer TCL may include Mo, Ti, Cu, Al, or an alloy thereof.

The sensing insulating layer TIL is located on the sensing conductive layer TCL. The sensing insulating layer TIL may be located on the entire surface of the substrate SUB to cover the sensing conductive layer TCL. The sensing insulating layer TIL may insulate the sensing conductive layer TCL. The sensing insulating layer TIL may be in contact with the sensing buffer layer TBF.

The sensing insulating layer TIL may include an organic film and/or an inorganic film. The organic film may include at least one of, for example, an acrylic resin, a methacrylic resin, polyisoprene, a vinyl resin, an epoxy resin, a urethane resin, a cellulose resin, a siloxane resin, a polyimide resin, a polyamide resin, or a perylene resin. The inorganic film may include at least one of, for example, aluminum oxide, titanium oxide, silicon oxide, silicon oxynitride, zirconium oxide, or hafnium oxide.

The passivation layer 500 may be located on the sensing insulating layer TIL. As already mentioned above, the passivation layer 500 may protect the sensing layer TSL. The passivation layer 500 may be located in the display area DA. For example, the passivation layer 500 may be located on the inside of the first bending line BL1, on part of the sensing insulating layer TIL in the flat part FA that overlaps with the display area DA. Thus, one of the sides of the passivation layer 500 may be located on the inside of the first bending line BL1.

Display devices according to other embodiments of the present disclosure will hereinafter be described. In the description that follows, like reference numerals indicate like elements, and descriptions of elements or features that have already been described above will be omitted, or at least simplified.

Figure 10:
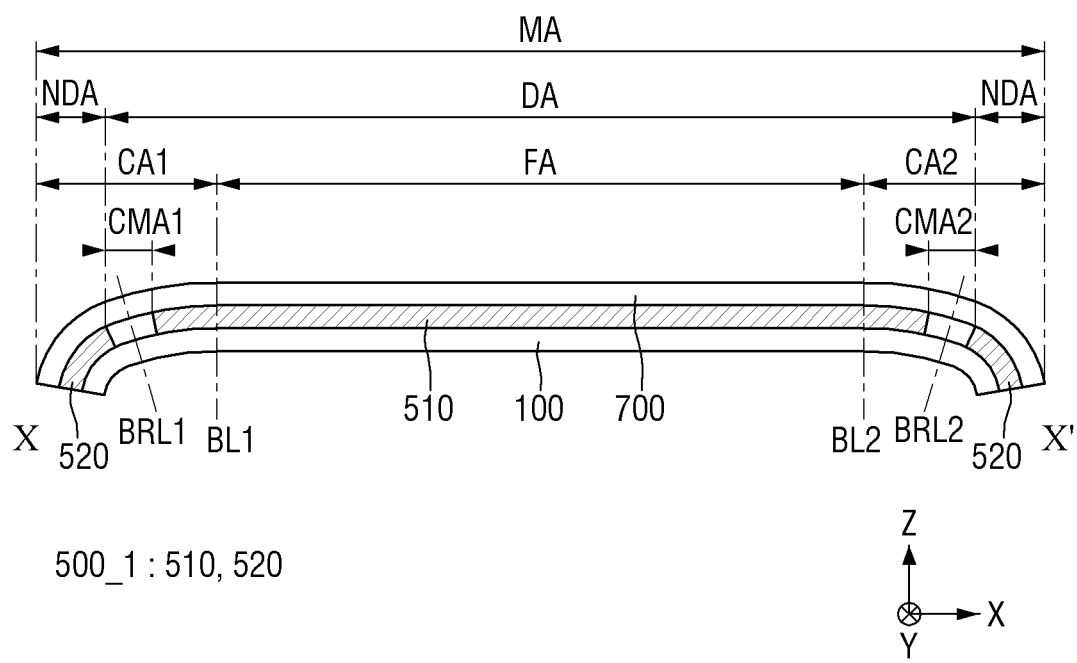
FIG. 10 is a cross-sectional view of a display device according to some example embodiments of the present disclosure.
Figure 11:
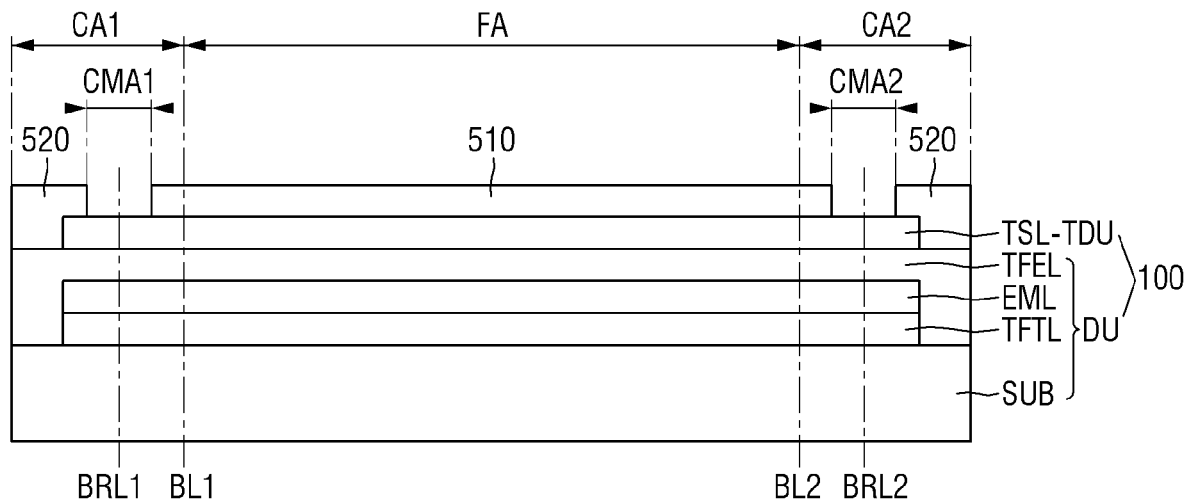
FIG. 11 is a cross-sectional view illustrating how a display panel and a passivation layer of FIG. 10 are stacked.
Figure 12:
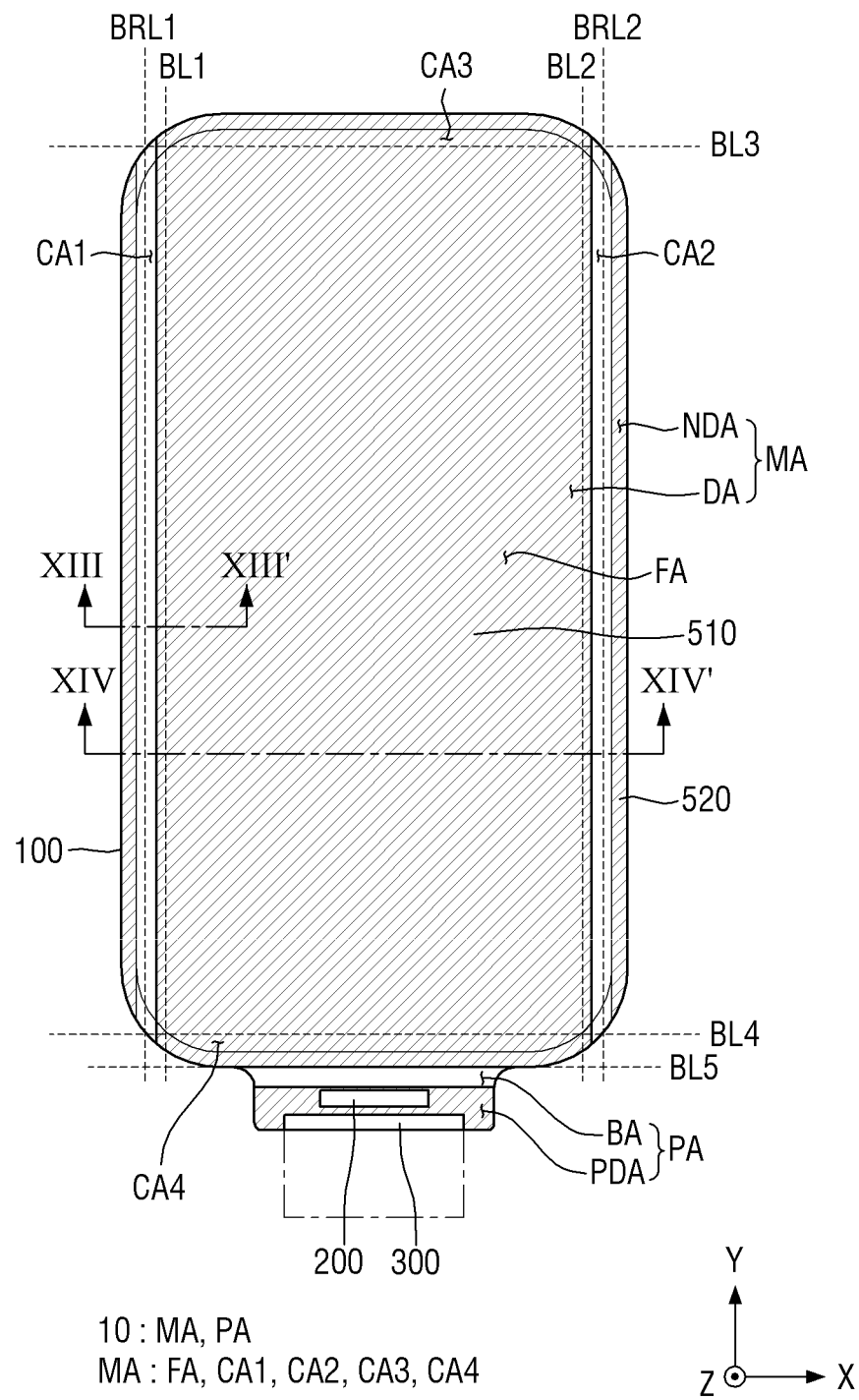
FIG. 12 is a layout view illustrating the arrangement of the display panel and the passivation layer of FIG. 10.
Figure 13:
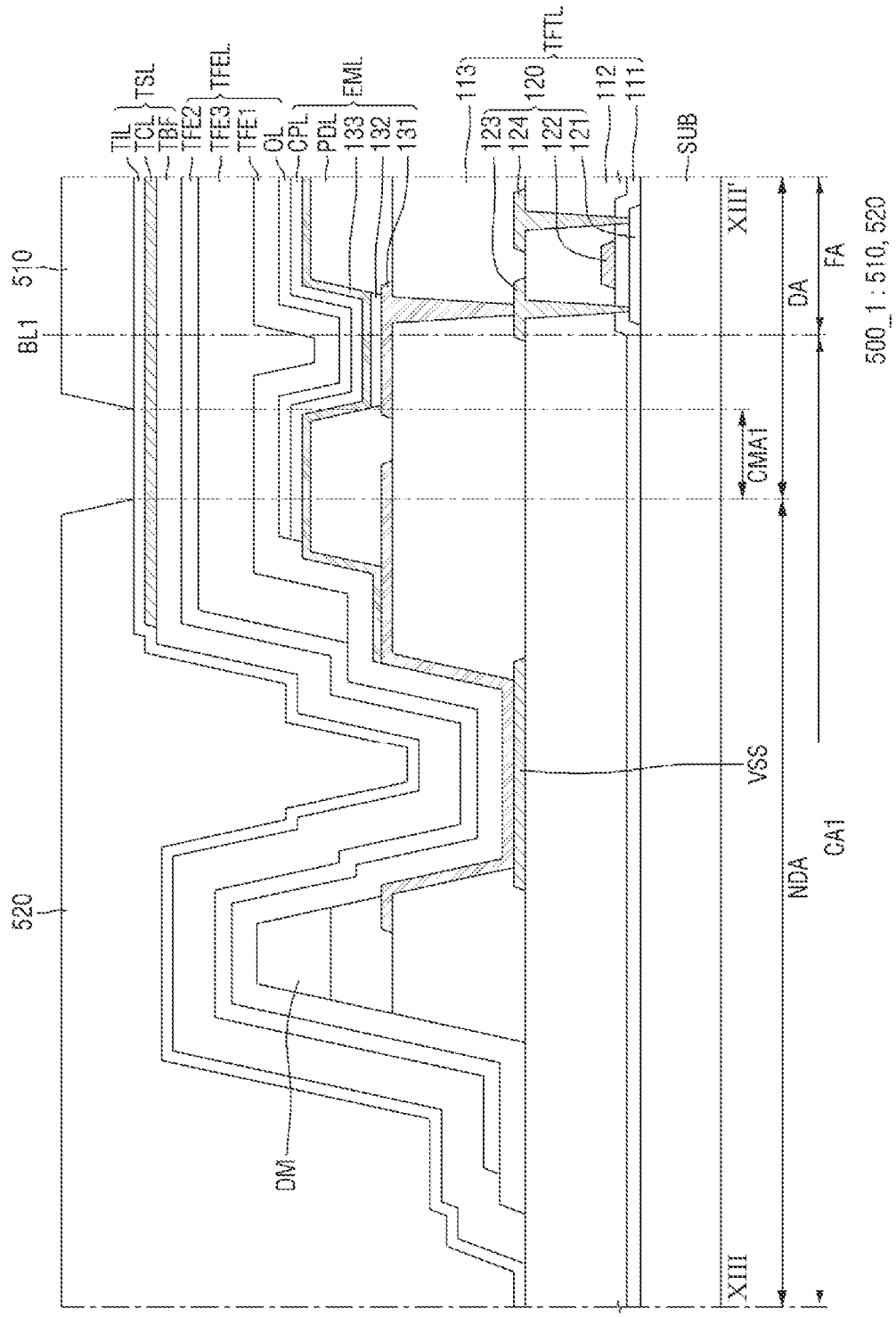
FIG. 13 is a cross-sectional view taken along the line XIII-XIII' of FIG. 12.

FIG. 10 is a cross-sectional view of a display device according to some example embodiments of the present disclosure. FIG. 11 is a cross-sectional view illustrating how a display panel and a passivation layer of FIG. 10 are stacked. FIG. 12 is a layout view illustrating the arrangement of the display panel and the passivation layer of FIG. 10. FIG. 13 is a cross-sectional view taken along line XIII-XIII' of FIG. 12.

The embodiment of FIG. 10 differs from the embodiment of FIG. 8 in that a passivation layer 500_1 is arranged even on first and second curved parts CA1 and CA2 of a display panel 100, but exposes parts of the first and second curved parts CA1 and CA2.

Referring to FIGS. 10 through 13, the first curved part CA1 may include a first minimum curved part CMA1, which includes a first minimum bending line BRL1. The first curved part CA1 may be formed to bent to have a first curvature, and the first minimum curved part CMA1 may be part of the first curved part CA1 that has a minimum curvature. Similarly, the second curved part CA2 may be formed to bent to have a second curvature. The second minimum curved part CMA2 may be part of the second curved part CA2 that has a minimum curvature.

However, the present disclosure is not limited to this. The first and second curvatures may vary and may become smaller in a direction away from a flat part FA. Thus, the first and second minimum curved parts CMA1 and CMA2 may be located on the outside of the flat part FA.

As already mentioned above, a sensing layer TSL may include sensing electrodes, which are located in a display area DA (or a sensing area TSA), and sensing lines, which are located in a non-display area NDA (or a sensing peripheral area TPA). For example, the flat part FA, the first minimum curved part CMA1, and the second minimum curved part CMA2 may be arranged to overlap with the display area DA, and parts of the first and second curved parts CA1 and CA2 on the outside of the first and second minimum curved parts CMA1 and CMA2 may overlap with the non-display area NDA.

The passivation layer 500_1 may include a first passivation layer 510, which is arranged on the sensing electrodes in the display area DA, and second passivation layers 520, which are located on the sensing lines in the non-display area NDA. The first passivation layer 510 and the second passivation layers 520 may not be located on the first and second minimum curved parts CMA1 and CMA2. Thus, the first passivation layer 510 may be spaced apart from the second passivation layers 520 by the first and second minimum curved parts CMA1 and CMA2.

Referring to FIGS. 12 and 13, the first passivation layer 510 may be located on the entire surface of the flat part FA, may extend to the right from the left side of the flat part FA until reaching the first minimum curved part CMA1, and may extend to the left from the right side of the flat part FA until reaching the second minimum curved part CMA2. That is, the first passivation layer 510 may be located on the entire surface of the flat part FA and may extend outwardly beyond the flat part FA, but may not be located on the first and second minimum curved parts CMA1 and CMA2.

The first passivation layer 510 may be located on parts of the sensing layer TSL that overlap with the first and second curved parts CA1 and CA2, on the outside of first and second bending lines BL1 and BL2. For example, a first side of the first passivation layer 510 may be arranged on the outside of the first bending line BL1, and a second side of the first passivation layer 510 may be arranged on the outside of the second bending line BL2. Thus, the first passivation layer 510 may be located on the sensing electrodes in the display area DA (or the sensing area TSA) to protect the sensing electrodes.

The second passivation layers 520 may be located in regions where the first and second curved parts CA1 and CA2 overlap with the non-display area NDA (or the sensing peripheral area TPA). Because the second passivation layers 520 are located in parts of the non-display area NDA that overlap with the first and second curved parts CA1 and CA2, the second passivation layers 520 may be located on the sensing lines in the non-display area NDA to protect the sensing lines.

Because the passivation layer 500_1, which is located on the sensing layer TSL, is not located on the first and second minimum curved parts CMA1 and CMA2, which are parts of the first and second curved parts CA1 and CA2 that have a minimum curvature, cracks that may be generated in the first and second minimum curved parts CMA1 and CMA2 during the formation of the first and second curved parts CA1 and CA2 can be prevented, and as a result, a display device 10 with high reliability can be provided. Also, because the passivation layer 500_1 is located in the non-display area NDA, but not on the first and second minimum curved parts CMA1 and CMA2 in the display area DA, the second passivation layers 520 of the passivation layer 500_1 can protect the sensing lines in the non-display area NDA.

Figure 14:
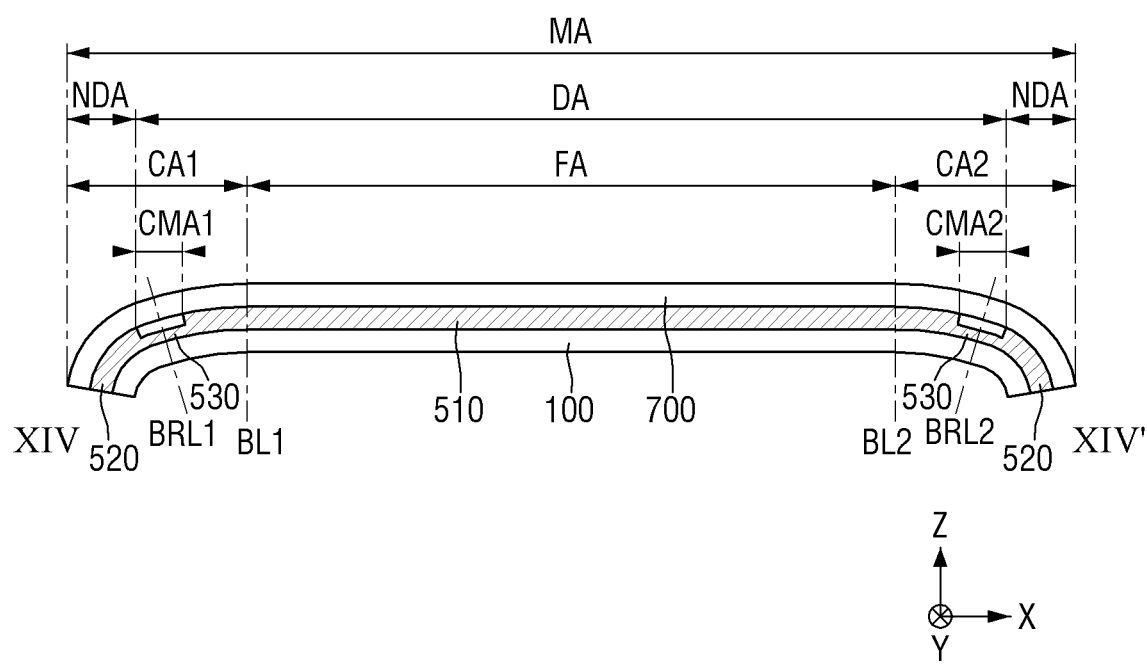
FIG. 14 is a cross-sectional view of a display device according to some example embodiments of the present disclosure.
Figure 15:
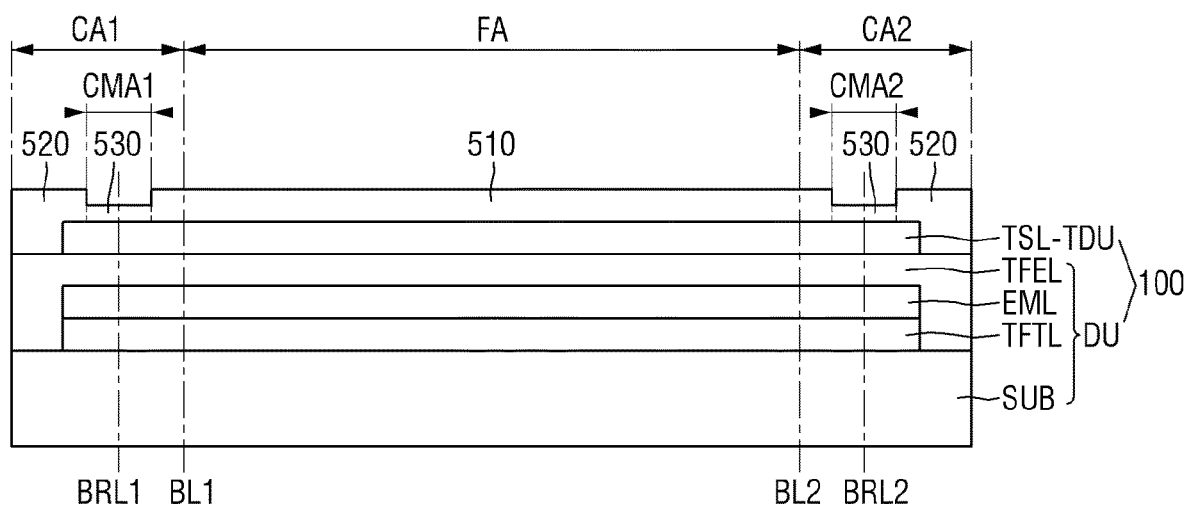
FIG. 15 is a cross-sectional view illustrating how a display panel and a passivation layer of FIG. 14 are stacked.
Figure 15:
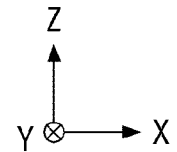
Figure 16:
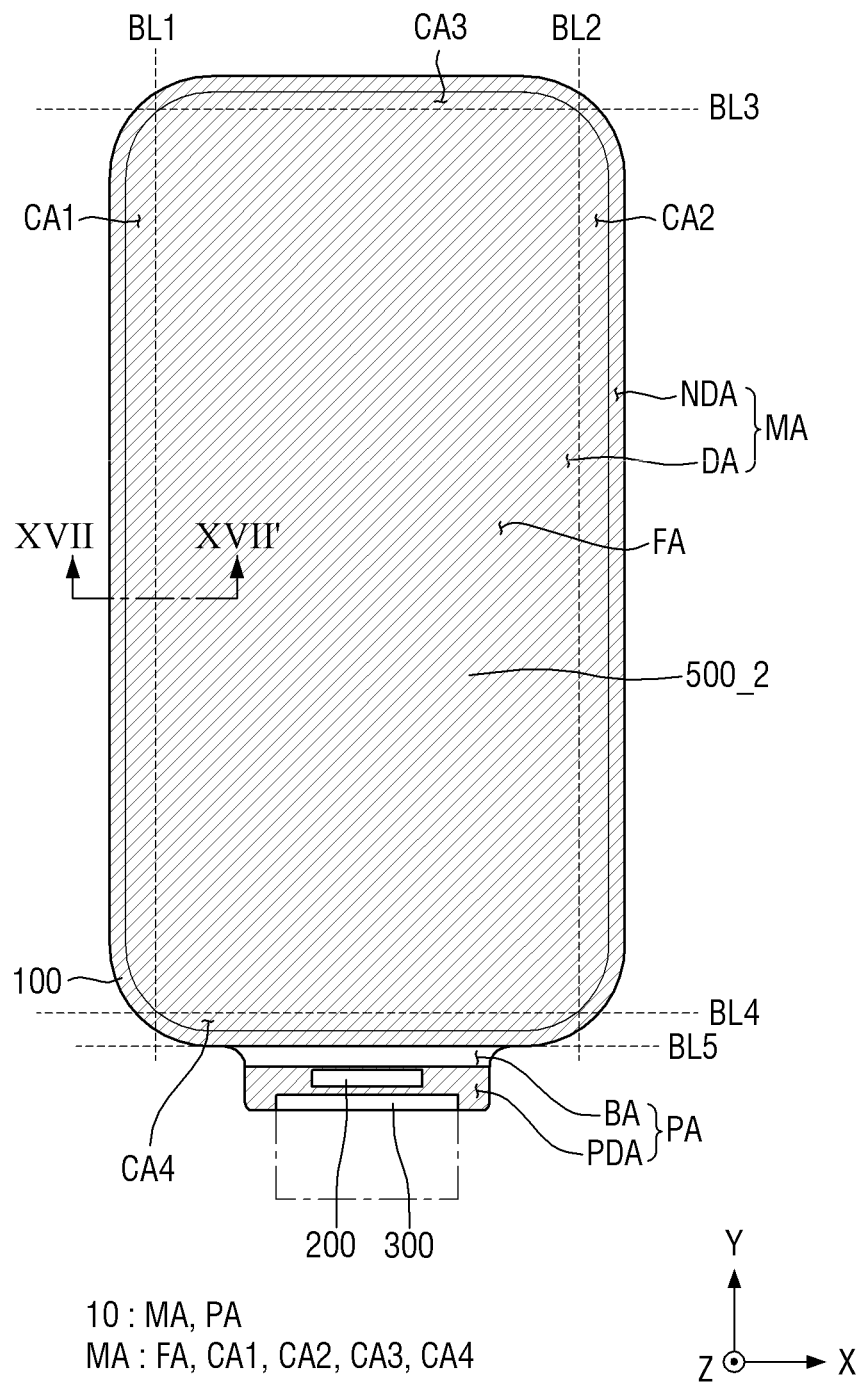
FIG. 16 is a layout view illustrating the arrangement of the display panel and the passivation layer of FIG. 14.
Figure 17:
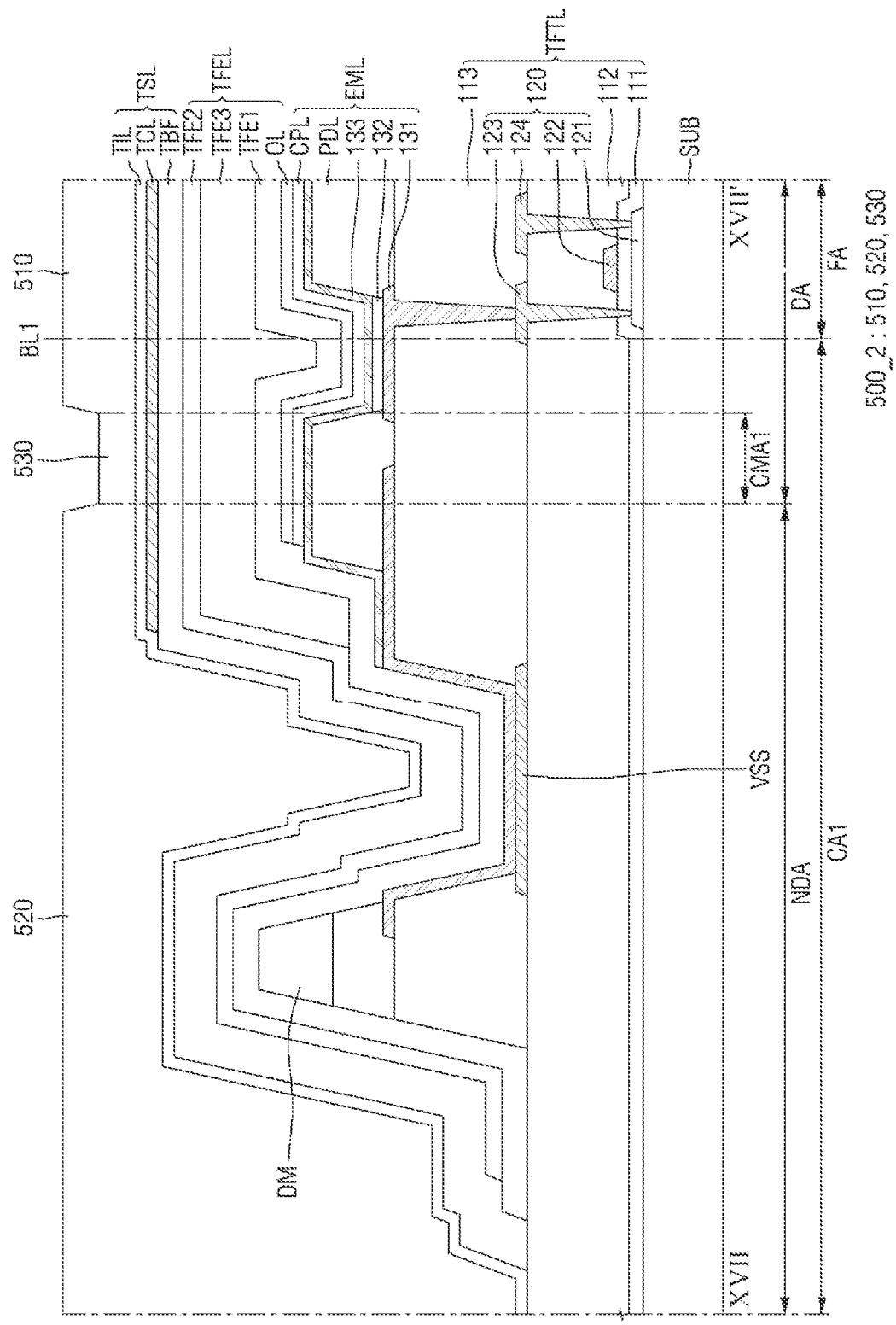
FIG. 17 is a cross-sectional view taken along the line XVII-XVII' of FIG. 16.

FIG. 14 is a cross-sectional view of a display device according to some example embodiments of the present disclosure. FIG. 15 is a cross-sectional view illustrating how a display panel and a passivation layer of FIG. 14 are stacked. FIG. 16 is a layout view illustrating the arrangement of the display panel and the passivation layer of FIG. 14. FIG. 17 is a cross-sectional view taken along line XVII-XVII' of FIG. 16.

The embodiment of FIG. 14 differs from the embodiments of FIGS. 8 and 10 in that a passivation layer 500_2 is located on the entire surface of a display panel 100, but is formed to have a height difference on part of the display panel 100, for example, on first and second minimum curved parts CMA1 and CMA2.

Referring to FIGS. 14 through 17, the passivation layer 500_2 may be arranged on the entire surface of an entire main area MA. The passivation layer 500_1 may include a first section 510, which overlaps with a first region including a flat part FA and curved parts that extend from the flat part FA and have curvature, second sections 520, which overlap with second regions located on the outside of the curved parts of the first region to be spaced apart from the curved parts of the first region and having curvature, and third sections 530, which overlap with third regions located between the first region and the second regions and having a minimum curvature, i.e., minimum curved parts (CMA1 and CMA2). The passivation layer 500_2 may have different thicknesses, i.e., may have a height difference. For example, the height of the third sections 530 of the passivation layer 500_2 may be smaller than the heights of the first section 510 and the second sections 520 of the passivation layer 500_2.

For example, the first section 510 of the passivation layer 500_2 may be formed on the entire surface of the flat part FA, may extend to the right from the left side of the flat part FA until reaching a first minimum curved part CMA1, and may extend to the left from the right side of the flat part FA until reaching a second minimum curved part CMA2. The first section 510 of the passivation layer 500_2 may extend from the upper and lower sides of the flat part FA to be formed on the entire surfaces of third and fourth curved parts CA3 and CA4. The first section 510 of the passivation layer 500_2 may have substantially the same structure as the first passivation layer 510 of FIG. 10.

The second sections 520 of the passivation layer 500_2 may be located in regions where a non-display area NDA overlaps with first and second curved parts CA1 and CA2. The second sections 520 of the passivation layer 500_2 may have substantially the same as the second passivation layers 520 of FIG. 10.

The third sections 530 of the passivation layer 500_2 may be located on the minimum curved parts (CMA1 and CMA2) of the first and second curved parts CA1 and CA2. For example, the third sections of the passivation layer 500_2 may be formed or arranged on the first and second minimum curved parts CMA1 and CMA2 of the first and second curved parts CA1 and CA2. The first section 510, the second sections 520, and the third sections 530 of the passivation layer 500_2 may be integrally formed.

Because the passivation layer 500_2 is formed to be relatively thin on the minimum curved parts (CMA1 and CMA2), which have a minimum curvature, cracks that may be generated in the minimum curved parts (CMA1 and CMA2) during the formation of the first and second curved parts CA1 and CA2 can be prevented.

Figure 18:
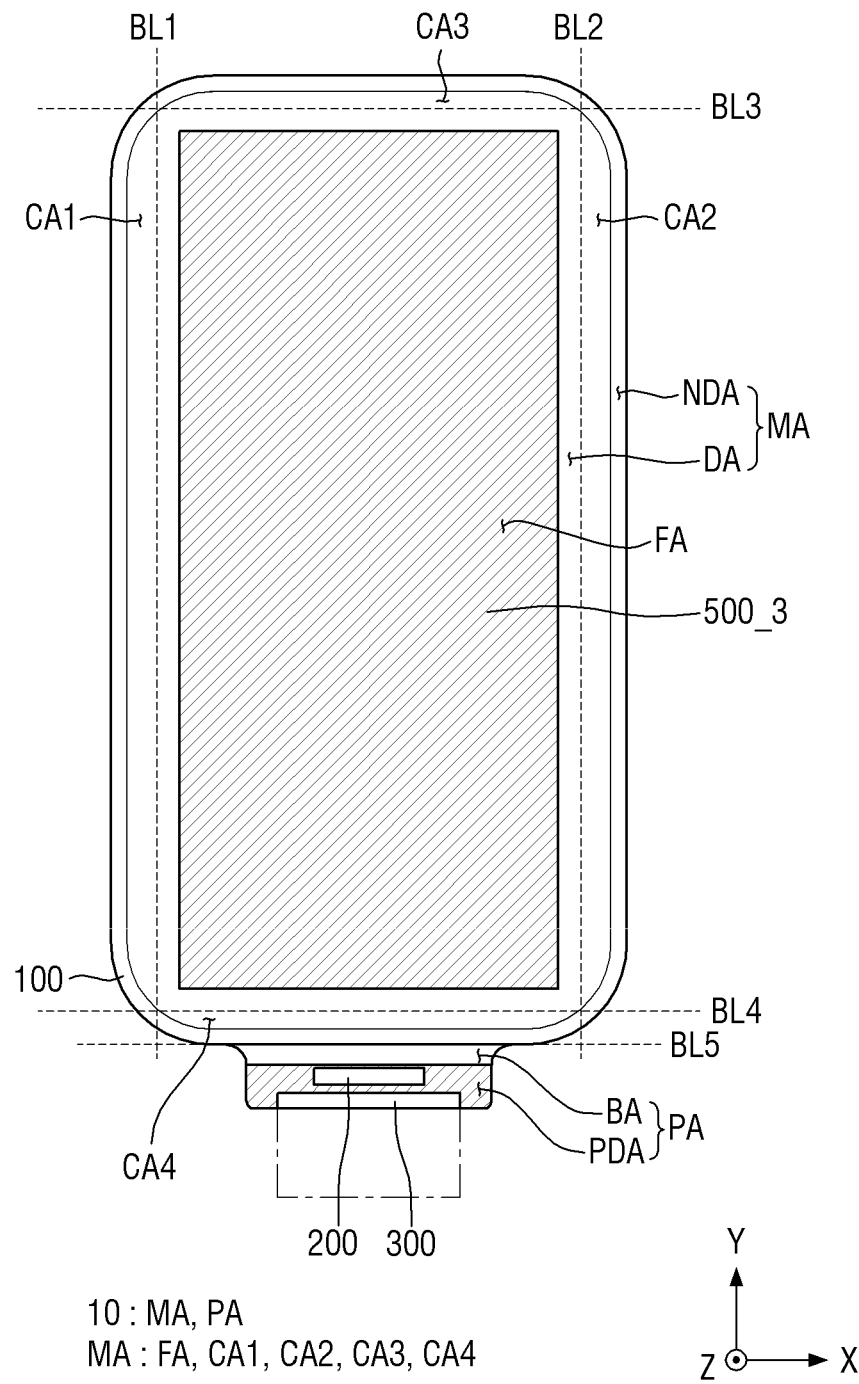
FIG. 18 is a layout view illustrating the arrangement of a display panel and a passivation layer of a display device according to some example embodiments of the present disclosure.

FIG. 18 is a layout view illustrating the arrangement of a display panel and a passivation layer of a display device according to some example embodiments of the present disclosure.

The embodiment of FIG. 18 differs from the embodiment of FIG. 8 in that a passivation layer 500_3 is not located on first, second, third, and fourth curved parts CA1, CA2, CA3, and CA4 of a display panel 100.

For example, referring to FIG. 18, the passivation layer 500_3 may be arranged to overlap with a flat part FA of the display panel 100 and may not be located at the first, second, third, and fourth curved parts CA1, CA2, CA3, and CA4. Thus, a first side (e.g., the left side) of the passivation layer 500_3 may be located on the inside of a first bending line BL1, a second side (e.g., the right side) of the passivation layer 500_3 may be located on the inside of a second bending line BL2, a third side (e.g., the upper side) of the passivation layer 500_3 may be located on the inside of a third bending line BL3, and a fourth side (e.g., the lower side) of the passivation layer 500_3 may be located on the inside of a fourth bending line BL4. In this case, because the passivation layer 500_3 is not located on the first, second, third, and fourth curved parts CA1, CA2, CA3, and CA4, cracks that may be generated during the formation of the, second, third, and fourth curved parts CA1, CA2, CA3, and CA4 can be prevented.

In concluding the detailed description, those skilled in the art will appreciate that many variations and modifications can be made to the example embodiments without substantially departing from the principles of the present invention. Therefore, the disclosed example embodiments of the invention are used in a generic and descriptive sense only and not for purposes of limitation.

What is claimed is:

1. A display device comprising:
   a display unit including a flat part and a curved part which is formed to be bent from sides of the flat part, the curved part including a display area;
   a sensing unit on the display unit to overlap with the flat part and the curved part; and
   a passivation layer on the sensing unit,
   wherein the passivation layer overlaps with the flat part and the passivation layer does not overlap the display area of the curved part, and
   wherein any portion of the passivation layer is not disposed between the sensing unit and the display unit.

2. The display device of claim 1, further comprising:
   a cover window on the passivation layer and overlapping the flat part and the curved part.

3. The display device of claim 1, wherein the curved part includes a first curved part, which is bent at a first curvature along a first bending line that is a first side of the flat part.

4. The display device of claim 3, wherein the first curvature is a varying curvature.

5. The display device of claim 3, wherein the first curvature becomes smaller in an outward direction away from the flat part.

6. The display device of claim 3, wherein a first side of the passivation layer is on an inside of the first bending line.

7. The display device of claim 3, wherein the curved part further includes a second curved part, which is bent at a second curvature along a second bending line that is a second side of the flat part.

8. The display device of claim 7, wherein first and second sides of the passivation layer are on an inside of the first and second bending lines, respectively.

9. A display device comprising:
   a display unit including a flat part and a curved part which is formed to be bent at a first curvature from sides of the flat part;
   a sensing unit on the display unit and overlapping with the flat part and the curved part; and
   a passivation layer on the sensing unit and overlapping with the flat part and the curved part,
   wherein the first curvature is a varying curvature,
   the curved part includes a minimum curved part having a first minimum curvature, and
   the passivation layer does not overlap the minimum curved part.

10. The display device of claim 9, wherein the passivation layer is at regions other than on the minimum curved part.

11. The display device of claim 9, wherein the first curvature becomes smaller in an outward direction away from the flat part.

12. The display device of claim 9, wherein
   the sensing unit includes a sensing area and a sensing peripheral area, which is at a periphery of the sensing area, and includes a sensing conductive layer on the display unit, and a sensing insulating layer on the sensing conductive layer, and
   the sensing conductive layer includes a sensing electrode in the sensing area, and a sensing line connected to the sensing electrode and in the sensing peripheral area.

13. The display device of claim 12, wherein
   the flat part overlaps the sensing area, and
   the curved part overlaps a portion of the sensing area and the sensing peripheral area.

14. The display device of claim 13, wherein the passivation layer includes a first passivation layer on the sensing electrode in the sensing area, and a second passivation layer on the sensing line in the sensing peripheral area.

15. The display device of claim 14, wherein the first passivation layer and the second passivation layer are spaced apart from each other.

16. The display device of claim 14, further comprising:
   a cover window on the passivation layer overlapping the flat part and the curved part.

17. A display device comprising:
   a display unit including a first region, which includes a flat part and a curved part extending from the flat part and having a first curvature, a second region spaced apart from the curved part of the first region and having a second curvature, and third region between the curved part of the first region and the second region and having a third curvature;
   a sensing unit overlapping the first region, the second region, and the third region of the display unit; and
   a passivation layer overlapping the first region, the second region, and the third region of the display unit, the passivation layer includes a first section overlapping the first region, a second section overlapping with the second region, and a third section overlapping the third region and having a smaller height than the first section and the second section.

18. The display device of claim 17, wherein the third curvature is smaller than the first and second curvatures.

19. The display device of claim 18, further comprising a cover window on the passivation layer.

20. The display device of claim 18, wherein
   the sensing unit includes a sensing conductive layer on the display unit, and a sensing insulating layer on the sensing conductive layer, and the sensing conductive layer includes a sensing electrode overlapping the first region, and a sensing line connected to the sensing electrode and located in the second region.

21. A display device comprising:
a display unit including a flat part and a curved part which is formed to be bent from sides of the flat part;
a sensing unit on the display unit to overlap with the flat part and the curved part; and
a passivation layer on the sensing unit,
wherein the sensing unit is disposed between the passivation layer and the display unit, and
wherein the passivation layer overlaps with the flat part and the passivation layer does not overlap the curved part.

* * * * *